United States Patent [19]
Cook et al.

[11] Patent Number: 5,850,539
[45] Date of Patent: Dec. 15, 1998

[54] AUTOMATED SYSTEM FOR FACILITATING CREATION OF A RACK-MOUNTABLE COMPONENT PERSONAL COMPUTER

[75] Inventors: Matthew Damian Cook; Roberta Walton Hensley; Barry Donald Adkins, all of Houston; Erik Stefan Peterson, Tomball; Richard Frederick Roesler, Houston; James Michael Parks, Richmond, all of Tex.

[73] Assignee: Compaq Computer Corporation, Houston, Tex.

[21] Appl. No.: 934,534

[22] Filed: Sep. 22, 1997

[51] Int. Cl.[6] .................................................. G06F 17/50
[52] U.S. Cl. ............................................................ 395/500
[58] Field of Search ............................................. 395/500

[56] References Cited

U.S. PATENT DOCUMENTS

| | | | |
|---|---|---|---|
| 4,591,983 | 5/1986 | Bennett et al. | 364/403 |
| 4,870,591 | 9/1989 | Cicciarelli et al. | 364/478 |
| 5,257,387 | 10/1993 | Richek et al. | 395/800 |
| 5,460,441 | 10/1995 | Hastings et al. | 312/298 |
| 5,499,357 | 3/1996 | Sonty et al. | 395/500 |
| 5,515,524 | 5/1996 | Lynch | 395/500 |
| 5,560,022 | 9/1996 | Dunstan et al. | 395/750 |

FOREIGN PATENT DOCUMENTS

WO 94/23372  10/1994  WIPO .............................. G06F 13/00

*Primary Examiner*—Vincent N. Trans
*Attorney, Agent, or Firm*—Beyer & Weaver, LLP

[57] ABSTRACT

An automated system for facilitating creation of a compatible rack-mountable component personal computer. The system comprises: (1) data storage circuitry for containing a database of component data, the component data including a list of alternative computer components and a group of computer component characteristics associated with each of the alternative computer components, (2) data display circuitry for displaying graphical representations, on an associated display device, of multiple portions of the component data to a user, (3) data input circuitry for accepting user selection data from the user, the user selection data including chosen ones of the list of alternative computer components, the user providing the user selection data by manipulating the graphical representations on the display device and (4) data processing circuitry for evaluating a compatibility of the chosen ones of the list of alternative computer components, the evaluating means employing the associated group of computer component characteristics to determine the compatibility, the chosen ones of the list of alternative computer components forming a portion of computer configuration data, the data display circuitry capable of displaying the computer configuration data to the user.

29 Claims, 21 Drawing Sheets

5,850,539

AUTOMATED SYSTEM FOR FACILITATING CREATION OF A RACK-MOUNTABLE COMPONENT PERSONAL COMPUTER

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention is directed, in general, to computer systems and, more specifically, to an automated system capable of allowing a relatively unsophisticated user to select components of a rack-mountable personal computer, the system evaluating a compatibility of the components, arranging the components within a rack, selecting interconnecting cables and producing a printed order for ordering the appropriate components.

2. Description of Related Art

In the interest of installation floor space economy, main portions of high capacity computer systems are often mounted in rack structures that typically comprise vertically elongated, floor mounted cabinet assemblies of standard sizes. The cabinet assembly conventionally used for this purpose typically includes a rectangular internal frame externally covered by removable panels. The cabinet assembly may have a front access door pivotally mounted on the front side of the cabinet assembly and typically made of a transparent material to expose various interior components of the overall rack-mountable personal computer ("PC"), such as monitors and various indicating lights, to view without the necessity of opening the access door.

One of the components conventionally incorporated into a rack-mountable PC is a central server, a high capacity computer operatively coupled to remotely located computer work stations. To provide access to the components of the central server, they are typically mounted in a server drawer structure slidably supported in the internal frame of the rack cabinet for movement relative thereto between a forwardly extended component access position, and rearwardly retracted operating position. Other components that make-up a rack-mountable PC include a storage system, a keyboard, a monitor, a keyboard/monitor/mouse switch box, and an uninterruptable power supply. The components vertically mounted in the rack are easily accessible for connection, service and maintenance purposes.

Manual selection of a rack-mountable PC is an exacting task. First, the user must satisfy their needs by selecting components of a computer system having the processing capability, memory, and other features necessary to match their guidelines. Then, several ancillary concerns must be addressed prior to the final selection of the components that constitute the rack-mountable PC.

Typically, a user selects components for a rack-mountable PC from a catalog or technical journal. The user selects each component to match their personal technical computing needs. For example, if the user wishes to use the PC for stand-alone word processing functions, then a low-end microprocessor (such as an Intel 80286) with a keyboard, monitor, printer and word processing software will be adequate. Alternatively, if the user wishes to use the PC as a central server in a local area network ("LAN") with multimedia capability, then a high powered server (having an 80486 or Pentium™processor) with complex memory, monitor, keyboard/monitor/mouse switch, printer and corresponding software is necessary.

Additionally, constructing a rack-mountable PC entails several significant ancillary tasks beyond selecting the processor, memory, and other components for a functional microcomputer. For example, the weight of each component must be reviewed so that the vertical placement of each component in the rack is properly coordinated from top to bottom and so that the rack as a whole is not overloaded. Simultaneously, the physical dimensions of each component in the computer system must be analyzed for the most economical selection of the rack size. Coordinating the size of the cabinet, with the proper arrangement of the components therein, is very important to ensure that the rack does not collapse or topple over, or that a component within the rack does not collapse from the overhead weight.

There are other significant ancillary concerns as well. For example, an area of concern in rack-mountable PCs of conventional construction is ventilating the interior of the cabinet for the purpose of dissipating heat generated therein by the various computer components while in operation. Thus, the thermal output of each component must be reviewed so that the components that dissipate the highest amount of heat may be isolated from others as much as possible. Furthermore, the power requirements of each component must be reviewed to ensure that the electrical service is available for the entire computer system. Ultimately, if either one of these requirements is overlooked, it is entirely possible that a component within the system would overheat leading to destruction of the component and system failure. Therefore, even though the aforementioned matters are considered ancillary concerns, each subject is vital and must be addressed for the proper construction of a rack-mountable PC.

For the foregoing reasons, thorough research and knowledge of computer systems and components is required to erect a rack-mountable PC. As a result, the manual selection of rack-mountable PCs is not for a novice. Even for a sophisticated user, the selection of the components for a rack-mountable PC with the primary and ancillary tasks is a complex process that should incorporate a fail-safe alert.

In light of the limitations involved with the manual selection of rack-mountable PCs and the growth of computer networks in the business world and every facet of human life, a "user-friendly" system for the selection of rack-mountable PCs is needed in the art.

Almost every business, large or small, is equipped with some level of microprocessor-based computer network. While the level of sophistication varies between businesses and networks, the user friendly system to select a rack-mountable PC must be applicable to any type of business or computer system requirement. Coincidentally, the evolution of microprocessor-based computer networks in the home further stems the need for a such user friendly selection system.

Additionally, the user-friendly system should have a mode of operation whereby a sophisticated user may use the system, similar in nature to the manual selection process described above, without requiring the automatic protections that are incorporated in other modes of operation of the system of the present invention for the unsophisticated user.

Accordingly, what is needed in the art is a system for automating the complex task of selecting compatible components in a rack-mountable component PC. In particular, the system should lead an unsophisticated user through the task in an intuitive fashion, and should automate as many ancillary considerations as possible.

SUMMARY OF THE INVENTION

To address the above-discussed deficiencies of the prior art, it is a primary object of the present invention to provide an automated system capable of allowing a relatively unsophisticated user to select components of a rack-mountable personal computer.

In the attainment of the above primary object, the present invention provides an automated system for facilitating creation of a compatible rack-mountable component personal computer. The system comprises: (1) data storage circuitry for containing a database of component data, the component data including a list of alternative computer components and a group of computer component characteristics associated with each of the alternative computer components, (2) data display circuitry for displaying graphical representations, on an associated display device, of multiple portions of the component data to a user, (3) data input circuitry for accepting user selection data from the user, the user selection data including chosen ones of the list of alternative computer components, the user providing the user selection data by manipulating the graphical representations on the display device and (4) data processing circuitry for evaluating a compatibility of the chosen ones of the list of alternative computer components, the evaluating means employing the associated group of computer component characteristics to determine the compatibility, the chosen ones of the list of alternative computer components forming a portion of computer configuration data, the data display circuitry capable of displaying the computer configuration data to the user. As used herein, "system" refers to the combination of the general purpose computer and software of the present invention employed to aid a user in the selection of components for a rack-mountable PC. The terms "rack-mountable PC", "computer" or "PC" refer to the computer being designed.

Thus, the present invention presents a user-friendly interface to the relatively unsophisticated user. The interface allows the user to select, in an intuitive and guided fashion, the components that the user desires to place in the rack-mountable computer. The system evaluates the compatibility and propriety of the chosen components, producing the evaluated computer configuration data to the user for the user's benefit.

In a preferred embodiment of the present invention, the data processing circuitry chooses a relative placement of the chosen ones of the list of alternative computer components in a mounting rack. As previously described, the mounting rack comprises a boxlike chassis having an open front end. Mounting rails on either side of the front end allow computer components to be mounted over each other within the boxlike chassis. For reasons to be described in detail, it is highly desirable that the components be placed in a certain order in the mounting rack. The system of the present invention preferably automates the task of placing the chosen components in the rack in the appropriate order.

In a preferred embodiment of the present invention, the display circuitry displays a graphical representation, on the associated display device, of a mounting rack containing the chosen ones of the list of alternative computer components. In this embodiment, the display actually shows the chosen components as they are to appear mounted in the mounting rack.

In a more preferred embodiment, the data display circuitry displays a graphical representation, on the associated display device, of a relative placement of the chosen ones of the list of alternative computer components in a mounting rack. This more preferred embodiment provides automated placement of the components in the mounting rack and display of the system's most preferred placement to the user on the display device.

In a preferred embodiment of the present invention, one of the computer component characteristics is a component power requirement. It is important that the rack-mountable computer be fitted with the proper power supplies. Therefore, one important characteristic guiding the selection of a compatible power supply is the combined power requirements of the chosen components.

In a preferred embodiment of the present invention, one of the computer component characteristics is a component thermal output. Heat production of the computer components is also useful in determining whether the chosen components can operate within an acceptable temperature range. Therefore, one important characteristic guiding the selection of a proper mounting rack and cooling components is the combined thermal output of the chosen components.

In a preferred embodiment of the present invention, the data processing circuitry selects interconnecting cables to couple the chosen ones of the list of alternative computer components. Since the system knows component characteristics and preferably determines placement within the mounting rack, the system should be allowed to automate selection of interconnecting cables and the like. Accordingly, the system is preferably provided with an understanding of interconnecting cable types and selection criteria.

In a preferred embodiment of the present invention, the system further comprises data printing circuitry for producing a printed order containing an enumeration of the chosen ones of the list of alternative computer components and interconnecting cables to couple the chosen ones of the list of alternative computer components. This allows the system to print out the printed order that contains all of the information necessary to effect an order of the chosen components from a preferred vendor. Further, the system may produce both graphical and verbal installation instructions to the user to allow the user to install the computer when the chosen components arrive.

In a preferred embodiment of the present invention, the display circuitry displays, on the associated display device, a warning to the user when there is an incompatibility among the chosen ones of the list of alternative computer components. Because the system understands component characteristics and can determine compatibility, the system should be able to warn the user upon the occurrence of an incompatibility. Accordingly, the system preferably does so by displaying a warning message to the user via the display device.

In a preferred embodiment of the present invention, the data storage circuitry, data display circuitry, data input circuitry and data processing circuitry form a portion of a PC. Those of ordinary skill in the art will understand that, while the scope of the present invention includes embodiment of the various circuitry in discrete digital circuits, the present invention is advantageously embodied as a sequence of instructions executable in a general purpose PC.

In a further aspect, the present invention provides a system for assembling computer configuration data from component data and user selection data, the configuration data to be displayed on a display means. The system comprises: (1) means for displaying multiple portions of the component data to a user, the component data including a list of alternative computer components and a group of computer component characteristics associated with each of the alternative computer components, (2) means for accepting the user selection data from the user, the user selection data including chosen ones of the list of alternative computer components, (3) means for evaluating a compatibility among the chosen ones of the list of alternative computer components, the evaluating means employing the associated group of computer component characteristics to determine the compatibility, the chosen ones of the list of alternative computer components forming a portion of the computer configuration data and (4) means for outputting the computer configuration data to the display means.

In a preferred embodiment of this aspect of the present invention, the displaying means comprises means for presenting a graphical representation of the list of alternative computer components on the display means. Again, the system is preferably embodied in general purpose data processing and storage circuitry.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
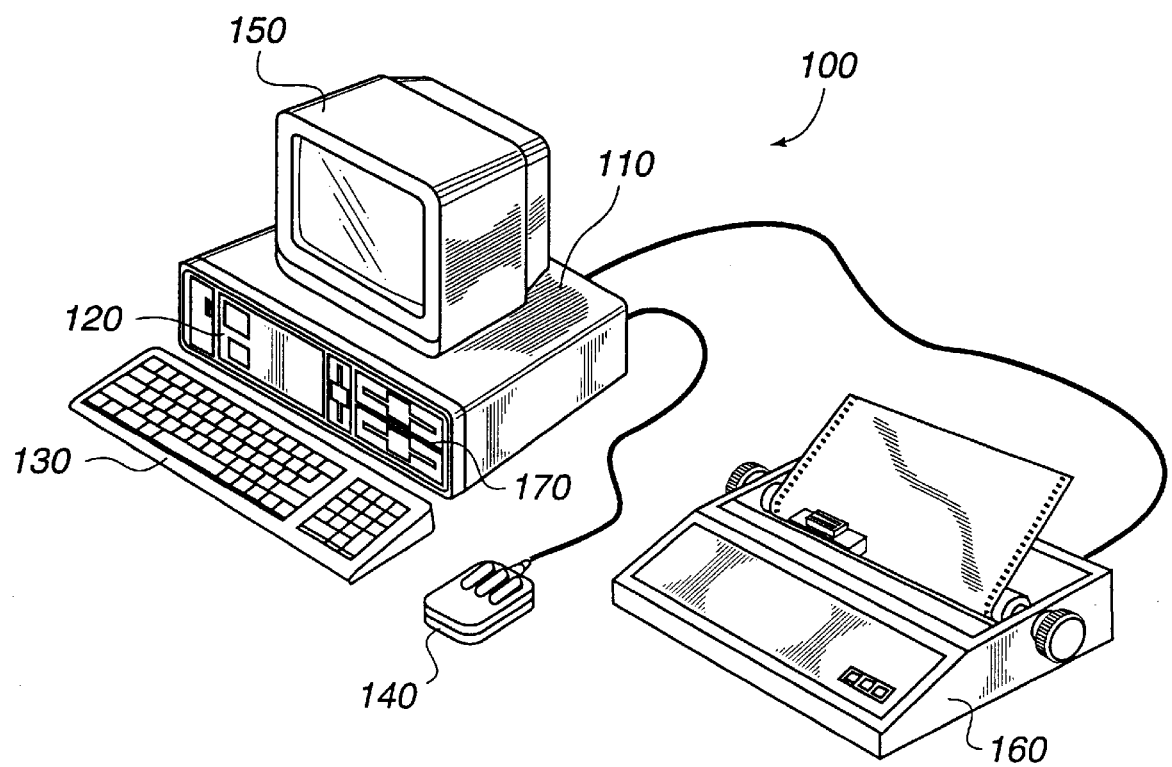
FIG. 1 illustrates an isometric view of a PC providing an environment within which the system of the present invention can operate.

Referring initially to FIG. 1, illustrated is an isometric view of a PC 100 that provides an environment within which the present invention can operate. Since the present invention is not limited to application in a PC environment, however, FIG. 1 is illustrative only. The PC 100 includes a main chassis 110, a dedicated hardware reset switch 120, a keypad 130, a mouse 140, a display device 150, a printer 160 and a disk drive 170 employed as a nonvolatile secondary storage device. The main chassis 110 houses various electronic components of the PC 100.

The display device 150 and the keypad 130 cooperate to allow communication between the PC 100 and a user. The mouse 140 provides a means by which the user can point to data displayed on the display device 150 to take action with respect thereto.

The dedicated hardware reset switch 120 is adapted to trigger hardware reset circuitry (not shown) within the main chassis 110 to "reboot" or restart the PC 100 when the user depresses the reset switch 120. The main chassis 110 further includes a power switch (not shown) capable of interrupting power from a main electrical power source (not shown in FIG. 1) to the PC 100. Interruption and restoration of power also brings about a restart of the PC 100.

Figure 2:
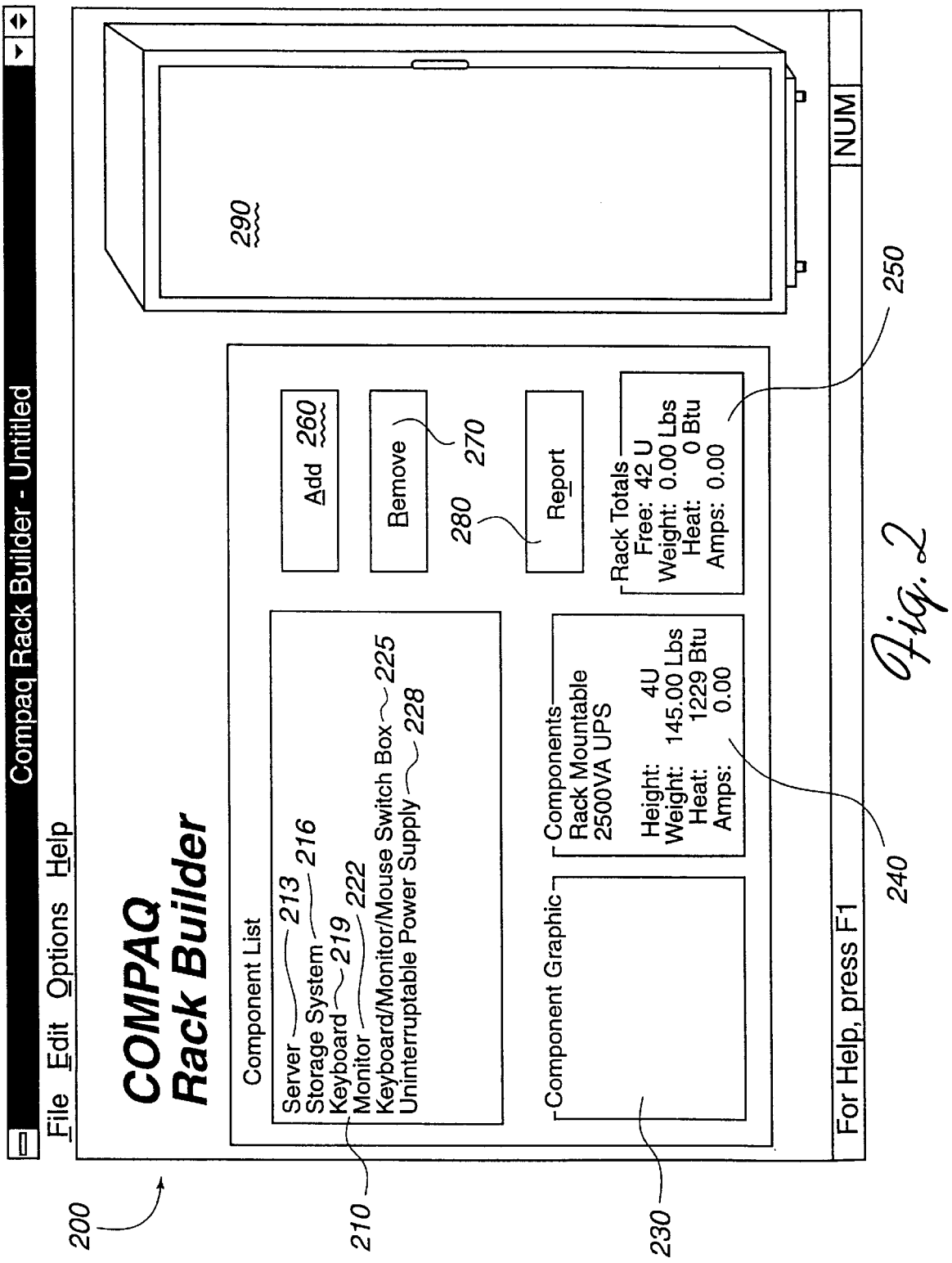
FIG. 2 illustrates a view of the display device of FIG. 1, showing, in particular, a configuration window.

Turning now to FIG. 2, illustrated is a view of the display device 150 of FIG. 1, showing, in particular, a configuration window 200. The configuration window 200 includes a component list area 210, a component graphic area 230, a component characteristic area 240, a rack total characteristic area 250, a selection add button 260, a selection remove button 270, a report button 280, and a rack representation area 290.

The component list area 210 of the configuration window 200 displays a list of alternative computer components that constitute the rack-mountable PC. The mounting rack comprises a boxlike chassis having an open front end. Mounting rails on either side of the front end allow computer components to be mounted over each other within the boxlike chassis. The list of alternative computer components include a server 213, a storage system 216, a keyboard 219, a monitor 222, a keyboard/monitor/mouse switch box or switch box 225 and an uninterruptable power supply ("UPS") 228.

The present invention is preferably embodied in general purpose data processing and storage circuitry and, is more preferably, a Microsoft Windows™-based system that allows fast, efficient simulations of alternative components within a rack representation. The system allows the user to add icons representing the alternative rack-mountable components to a graphical representation of the mounting rack. The configuration window 200 of the display device 150 in conjunction with the keypad 130 and/or mouse 140 provides the user with the interface to the system of the present invention.

The system includes rules and guidelines for safe configuration of the rack, such as almost always placing the heaviest component on the bottom. If an auto-arrange feature of the present invention is enabled, the rules and guidelines for safe configuration of the rack are automatically enforced. If the user is using manual placement, then only mandatory rack configuration rules must be adhered to.

The rack configuration rules include component placement rules, rack limit rules and required parts rules. Generally, the component placement rules begin with the evident requirement that all components are to be sorted by weight with the heaviest relegated to the bottom of the rack. More specifically under the component placement rules, the keyboard/monitor/mouse switch box 225 is to be placed above the keyboard 219. The keyboard 219 and monitor 222 have differing rules depending upon the size of the rack. On a 22-unit rack, the keyboard 219 is placed in the topmost position, below the switch box 225, and the monitor 222 is placed on top of the rack. On a 42-unit rack, the keyboard 219 is placed at a nominal height of 18 units; and the monitor 222 is placed in at the topmost position within the rack.

The rack limit rules indicate, in pertinent part, that if a UPS 228 is installed, its output rating may not be exceeded. Finally, the required parts rules specify the guidelines for completing the rack-mountable PC. For example, when using the keyboard/monitor/mouse switch box 225 a central processing unit ("CPU") to switch cable is included for each server 213. Also, if a 42-unit rack includes a keyboard 219 or a monitor 222, then a shelf is required. Furthermore, a stand-alone 42 unit rack requires three stabilizing kits and each group of one or more 42-unit racks may need a set of side panels. Finally, the number of coupling kits needed to couple a group of racks is one less than the number of racks in the group. The foregoing rules must be strictly followed when constructing a rack-mountable PC manually.

The other features of the configuration window 200 assist the user in the selection of the rack-mountable PC. The component graphic area 230 displays a graphic of each alternative component designated by the user while building the rack-mountable PC. The component characteristic area 240 displays component data including physical dimensions, weight, thermal output, and amperage draw of each alternative component designated by the user while building the rack-mountable PC. The thermal output characteristic specifies the heat production of the computer components. The thermal output characteristic is useful for the placement of each component within the rack and further to determine whether the chosen components can operate within an acceptable temperature range. The rack total characteristic area 250 displays rack configuration data including a total physical dimension, weight, thermal output and amperage draw for the sum of all of the chosen components in the rack-mountable PC and further specifies the remaining free space available in the rack for the addition of more components. The amperage draw provides the user with the component power requirement necessary to ensure that the electrical service is available to power up the rack-mountable PC.

The selection add button 260 and selection remove button 270 provide the user with the capability to add components or remove components from the rack representation area 290 during the process of building the rack-mountable PC. The selection process commences as follows. First, the user selects the type of component from the component list area 210. A component submenu appears on the configuration window 200 from which the user selects a chosen component. By marking the chosen component, a graphical representation and component characteristic data appear in their respective areas on the configuration window 200. When the user clicks on the selection add button 260 the chosen component is added to the rack representation area 290 and the component characteristics are added to the rack total characteristic area 250. The updated rack total characteristic area also displays the remaining free space in the corresponding rack. To remove a component from the rack representation area 290 the user selects the specific component from the component graphic area 210 and clicks on the selection remove button 270.

Components are repeatedly selected and removed as necessary until the user has all of the components loaded into the rack. As each component is added to the rack, the system of the present invention in the auto-arrange mode places the component in its optimal position within the rack representation, based on the set of defined placement rules addressed above.

The data processing circuitry selects interconnecting cables to couple the chosen ones of the list of alternative computer components. Since the system knows component characteristics and preferably determines placement within the mounting rack, the system should be allowed to automate selection of interconnecting cables and the like. Accordingly, the system is preferably provided with an understanding of interconnecting cable types and selection criteria.

After the rack-mountable PC is configured by the user, the system of the present invention checks for consistency and a final report is generated. The report button 280 provides access to a multiple page report including important data, site planning data, order information and graphical representation of the rack-mountable PC. To access this report the user may click the report button 280 on the configuration window 200, or select the report file from a file menu 300, or strike <CTRL>P on the keypad 130 of FIG. 1. For details of each report refer to the discussion below. Finally, the rack representation area 290 provides the user with a graphical representation of the rack-mountable PC, updated with each selection, configured by the user.

Figure 3:
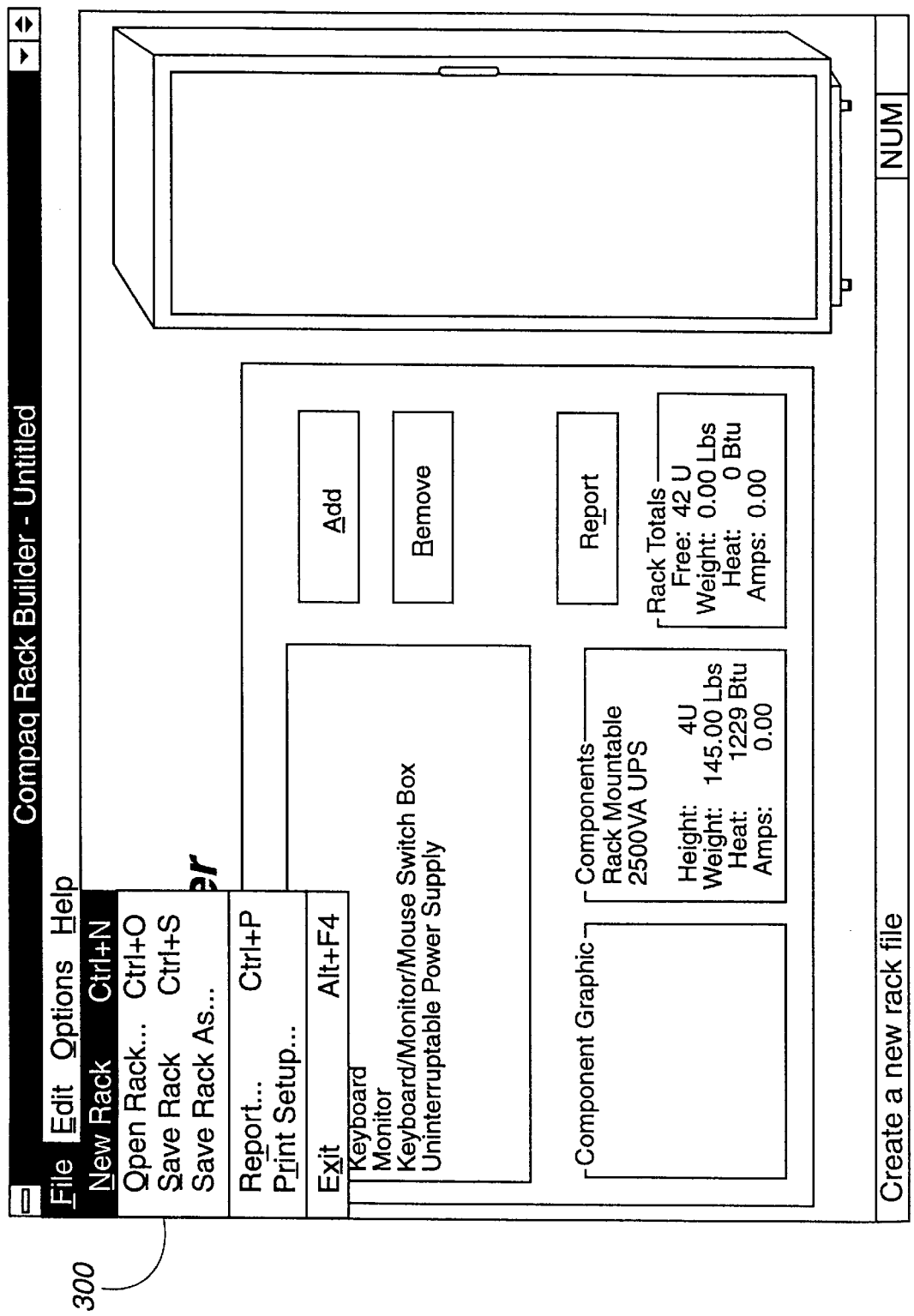
FIG. 3 illustrates a view of the configuration window of FIG. 2, showing, in particular, a file menu.

Turning now to FIG. 3, illustrated is a view of the configuration window 200 of FIG. 2, showing, in particular, a file menu 300. The file menu 300 provides the user access to a new or pre-configured rack. The file menu 300 also allows the user to save, print or display a report on a particular rack and finally provides the user with the ability to exit the system of the present invention.

Figure 4:
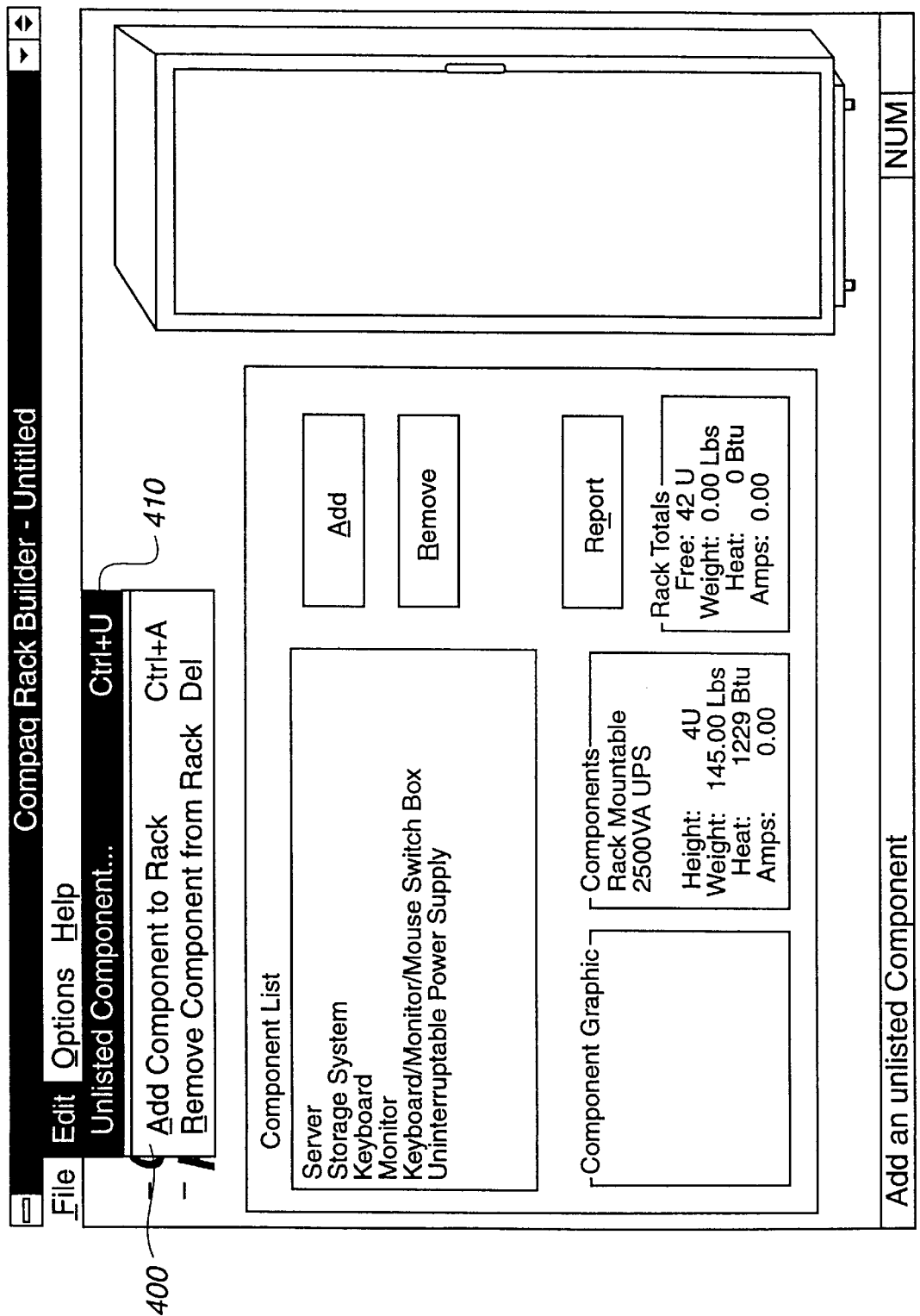
FIG. 4 illustrates a view of the configuration window of FIG. 2, showing, in particular, an edit menu.

Turning now to FIG. 4, illustrated is a view of the configuration window 200 of FIG. 2, showing, in particular, an edit menu. The edit menu 400 allows the creation of a "customized" component not included in the component list area 210 for insertion into a rack representation, or provides direct access to the add or remove functions previously discussed. To insert an unlisted component from the edit menu 400, the user clicks on the unlisted component field 410 and an unlisted component box (not shown) appears on the configuration window 200. The user then describes the unlisted component including part numbers and characteristic data so that the unlisted component can be incorporated into a rack. The user clicks an "OK" button on the unlisted component box to exit this function.

Figure 5:
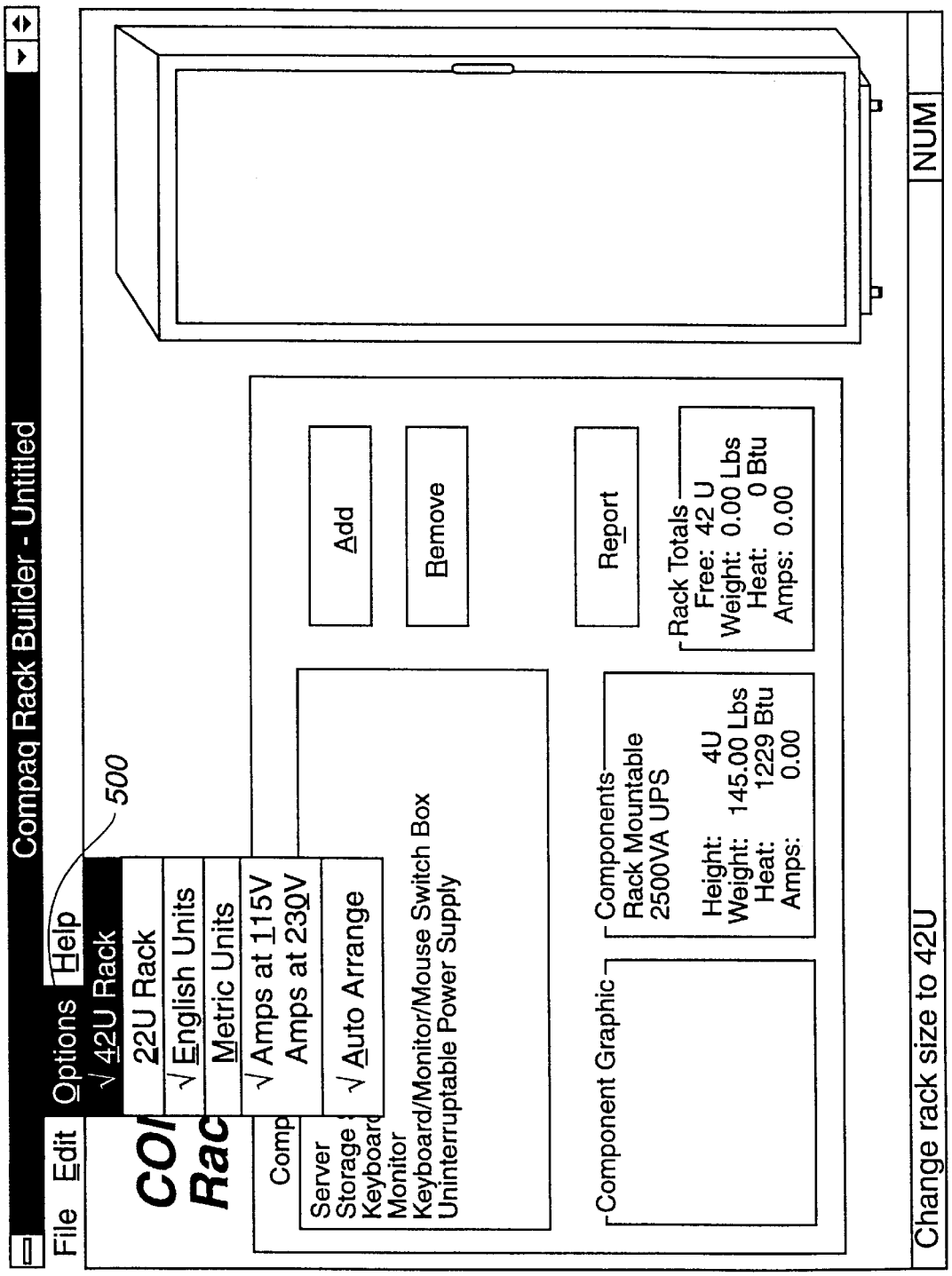
FIG. 5 illustrates a view of the configuration window of FIG. 2, showing, in particular, an option menu.

Turning now to FIG. 5, illustrated is a view of the configuration window 200 of FIG. 2, showing, in particular, an option menu 500. The option menu 500 allows the user to select a rack size, a unit of measurement for the characteristic data, and a voltage range for amperage draw. The option menu 500 also allows the user access to the auto-arrange function. As previously mentioned, the present invention presents a user-friendly interface to the relatively unsophisticated user. The interface allows the user to select, in an intuitive and guided fashion, the components that the user desires to place in a rack-mountable personal computer. The system evaluates the compatibility and propriety of the chosen components, producing the evaluated computer configuration data to the user for the user's benefit. The auto-arrange function accessible through the options menu 500 enforces the rules for safe rack configuration for the benefit of the unsophisticated user. However, the auto-arrange default can be turned off through the options menu 500 so that the user can place the components at any position within a rack. In this mode of operation, the user must adhere to the configuration rules discussed in detail above. The system of the present invention also provides a standard help menu (not shown) to assist the user in configuring a rack-mountable PC.

Figure 6:
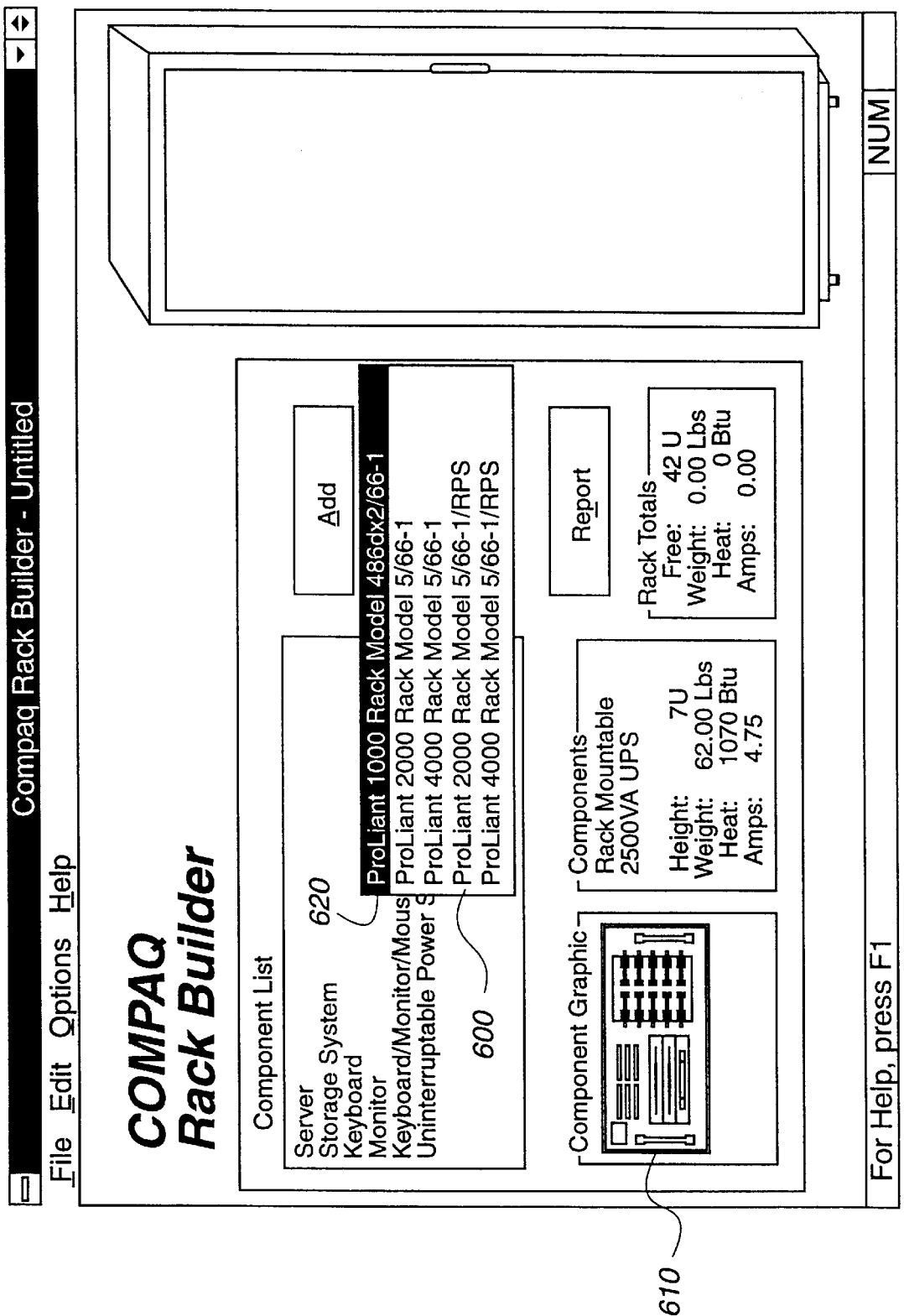
FIG. 6 illustrates a view of the configuration window of FIG. 2 showing, in particular, a server submenu and selection of a chosen server.

Turning now to FIG. 6, illustrated is a view of the configuration window 200 of FIG. 2, showing, in particular, a server submenu 600 and selection of a chosen server 620. A server 213 is typically a large minicomputer assigned to handle extensive calculations, file management, or other functions for a group of computers in a network. The server submenu 600 displays the alternatives available to the user for the server 213. When the user clicks on an alternative within the server submenu 600, a server icon 610 representing a chosen server 620 is graphically displayed in the component graphic area 230 of the configuration window 200 and the component data for the chosen server 620 appears in the component characteristic area 240 of the configuration window 200.

Figure 7:
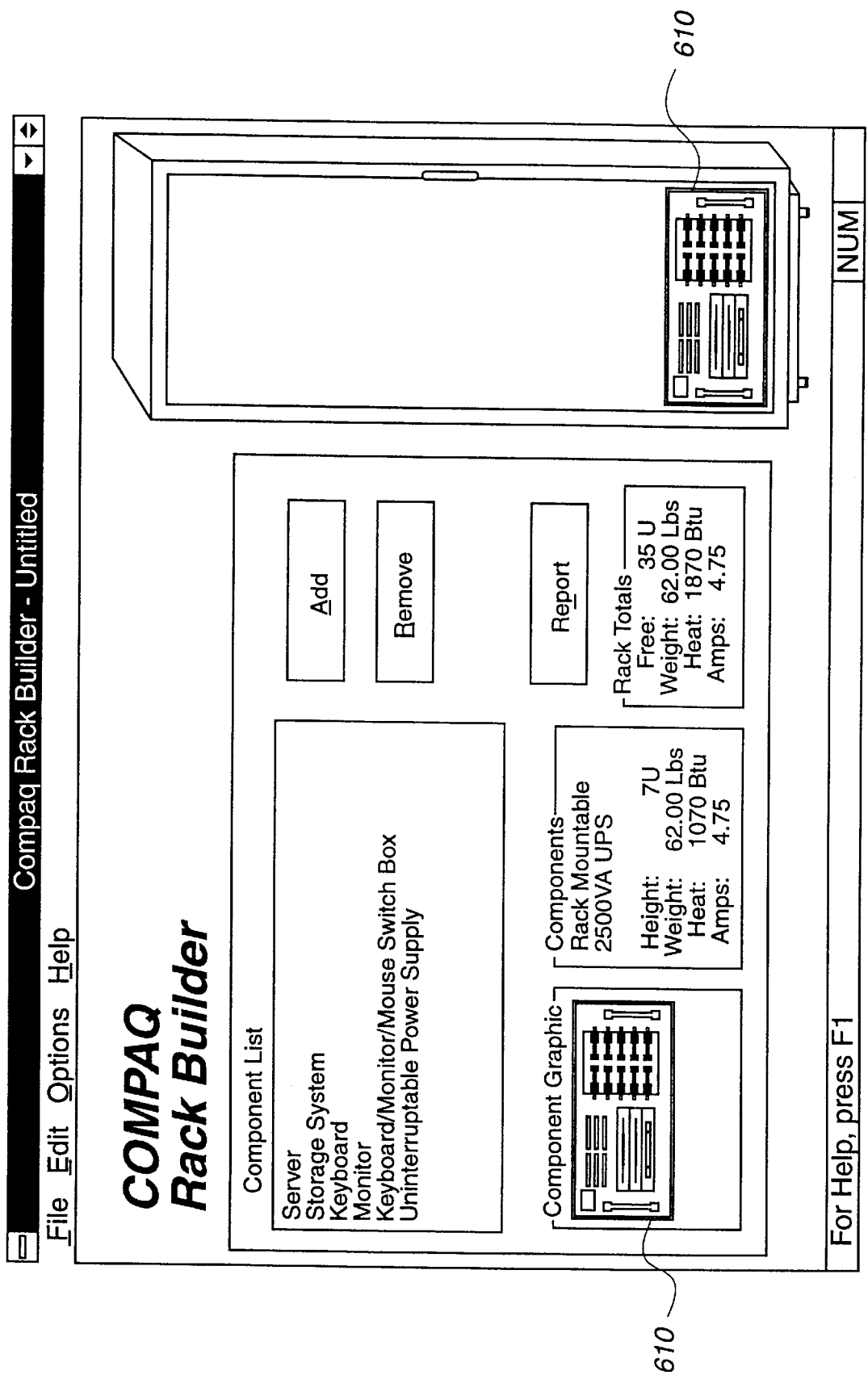
FIG. 7 illustrates a view of the configuration window of FIG. 2, showing, in particular, loading the chosen server into a rack representation.

Turning now to FIG. 7, illustrated is a view of the configuration window 200 of FIG. 2, showing, in particular, loading the chosen server 620 into a rack representation. The user adds the chosen server 620 selected in FIG. 6 to the rack representation area 290 by clicking on the selection add button 260. At this time, the server icon 610 is displayed in the rack representation area 290 of the configuration window 200 and the rack configuration data and remaining available free space are displayed in the rack total characteristic area 250.

Figure 8:
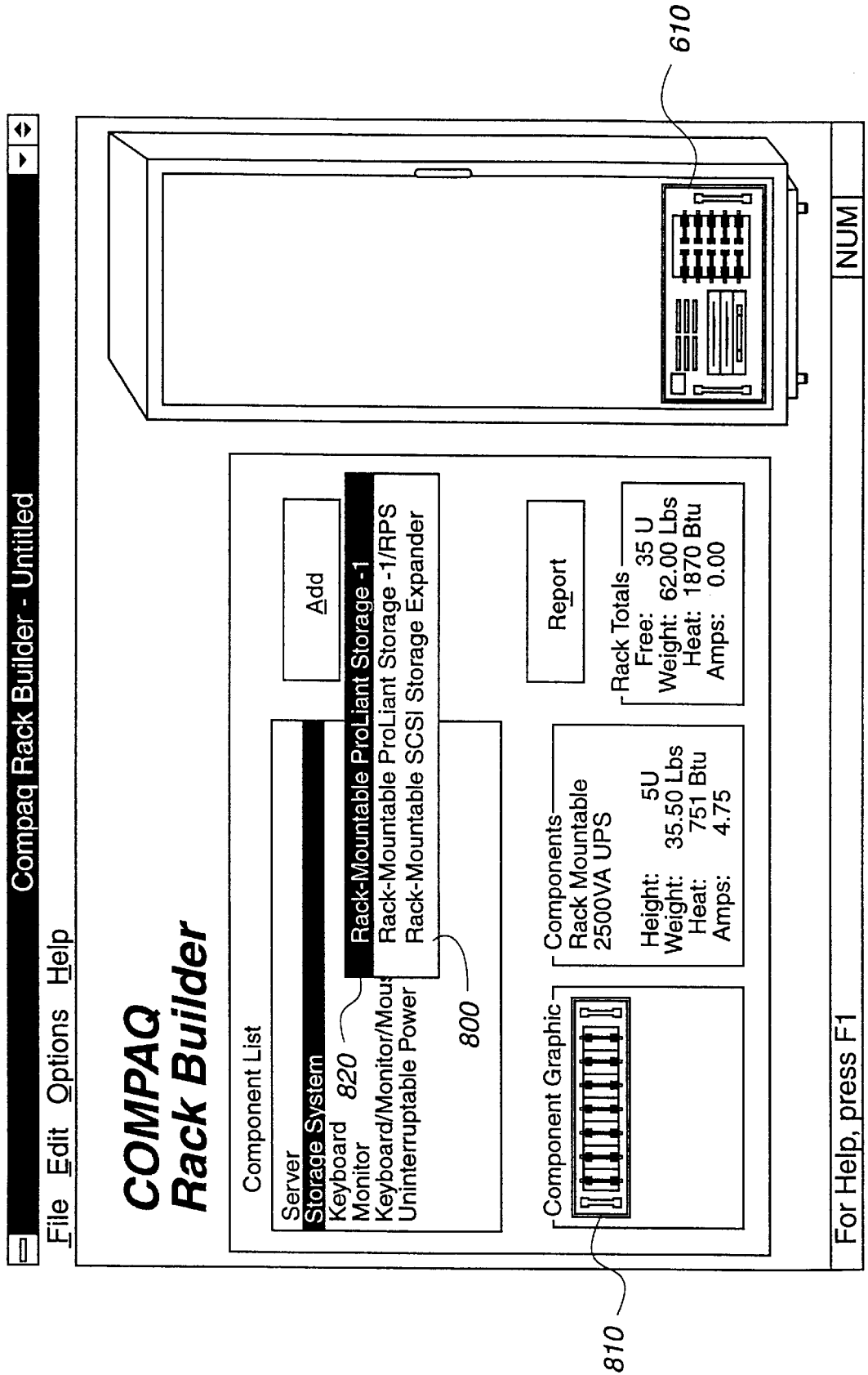
FIG. 8 illustrates a view of the configuration window of FIG. 2 showing, in particular, a storage system submenu and selection of a chosen storage system.

Turning now to FIG. 8, illustrated is a view of the configuration window 200 of FIG. 2, showing, in particular, a storage system submenu 800 and selection of a chosen storage system 820. A storage system 216 serves many purposes within a rack-mountable PC. First, the storage system 216 contains the instructions for executing a computer program within a PC. The storage system 216 also stores data inputted by the user for execution by the computer program. Finally, the storage system 216 accumulates the data processed as a result of the computer program. The storage system submenu 800 displays alternatives available to the user for the storage system 216. When the user clicks on an alternative within the storage system submenu 800, a storage system icon 810 representing the chosen storage system 820 is graphically displayed in the component graphic area 230 of the configuration window 200 and the component data for the chosen storage system 820 appears in the component characteristic area 240 of the configuration window 200.

Figure 9:
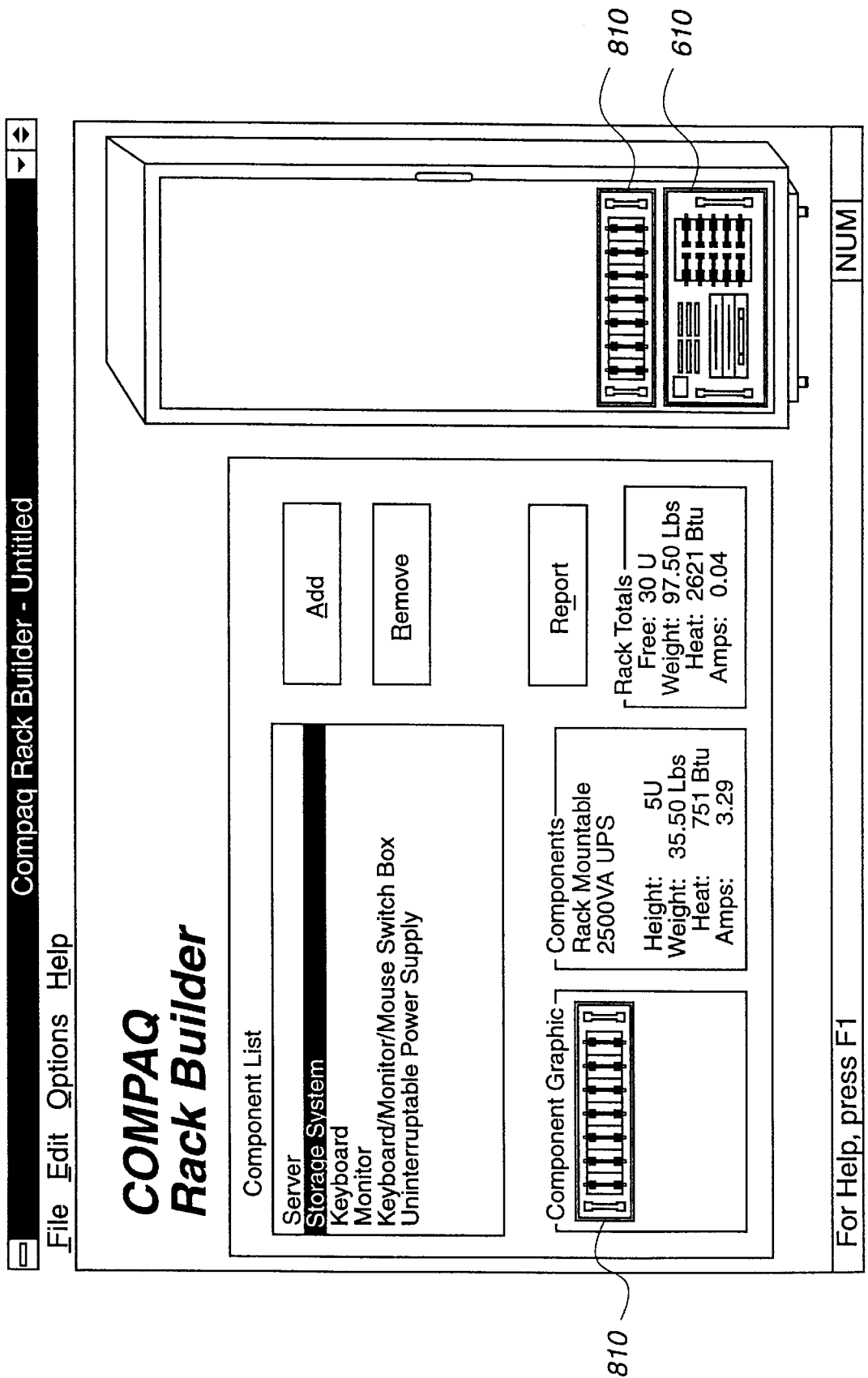
FIG. 9 illustrates a view of the configuration window of FIG. 2, showing, in particular, loading the chosen storage system into a rack representation.

Turning now to FIG. 9, illustrated is a view of the configuration window 200 of FIG. 2, showing, in particular, loading the chosen storage system 820 into a rack representation. The user adds the chosen storage system 820 selected in FIG. 8 to the rack representation area 290 by clicking on the selection add button 260. At this time, the storage system icon 810 is in the rack representation area 290 of the configuration window 200 with the server icon 610 and the rack configuration data and remaining available free space are displayed in the rack total characteristic area 250. Since the auto-arrange function is employed, the components are optimally placed in the rack representation.

Figure 10:
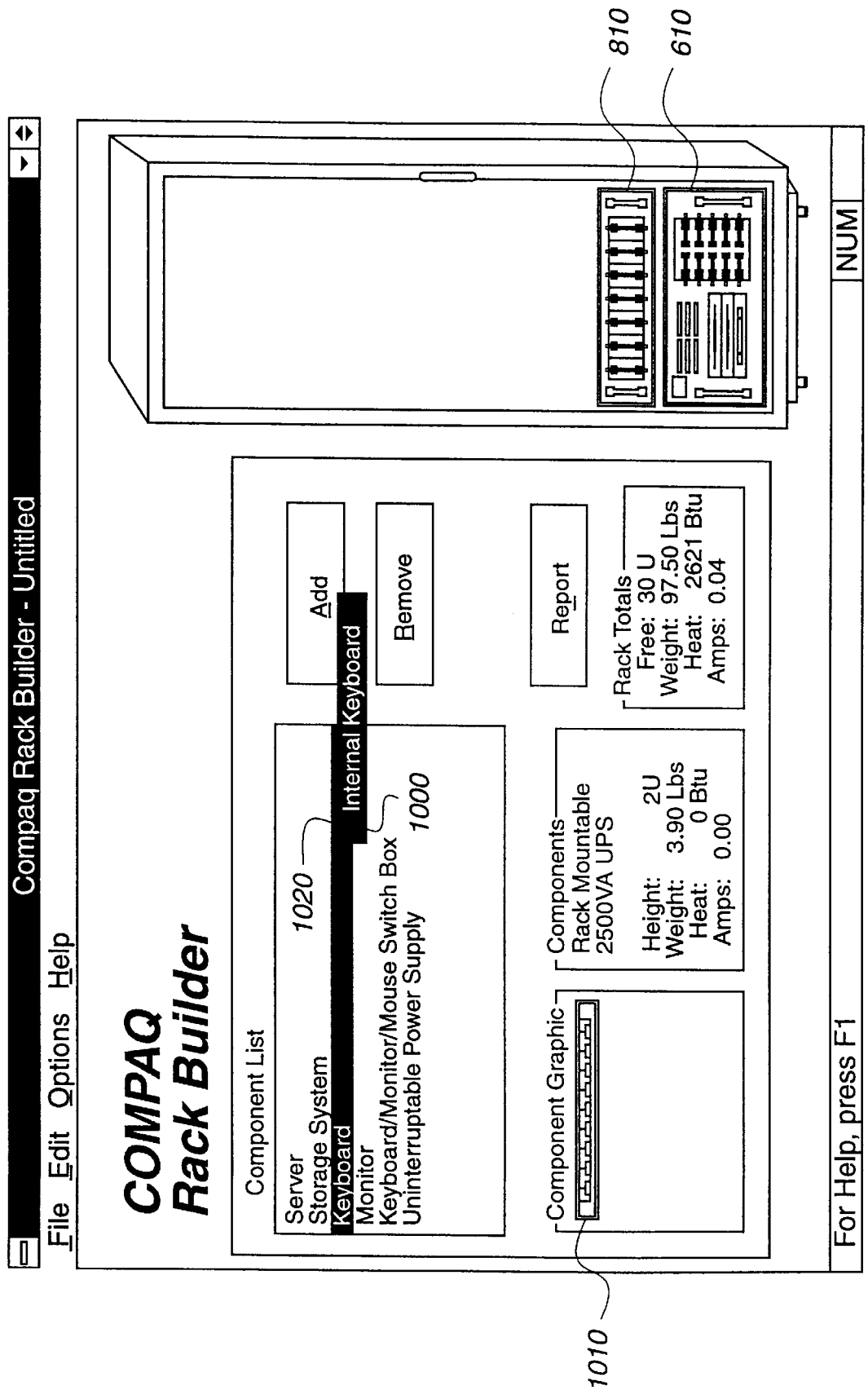
FIG. 10 illustrates a view of the configuration window of FIG. 2 showing, in particular, a keyboard submenu and selection of a chosen keyboard.

Turning now to FIG. 10, illustrated is a view of the configuration window 200 of FIG. 2, showing, in particular, a keyboard submenu 1000 and selection of a chosen keyboard 1020. A keyboard 219 provides the functional interface between the user and the system of the present invention. The keyboard submenu 1000 displays alternatives available to the user for the keyboard 219. When the user clicks on an alternative within the keyboard submenu 1000, a keyboard icon 1010 representing the chosen keyboard 1020 is graphically displayed in the component graphic area 230 of the configuration window 200 and the component data for the chosen keyboard 1020 appears in the component characteristic area 240 of the configuration window 200.

Figure 11:
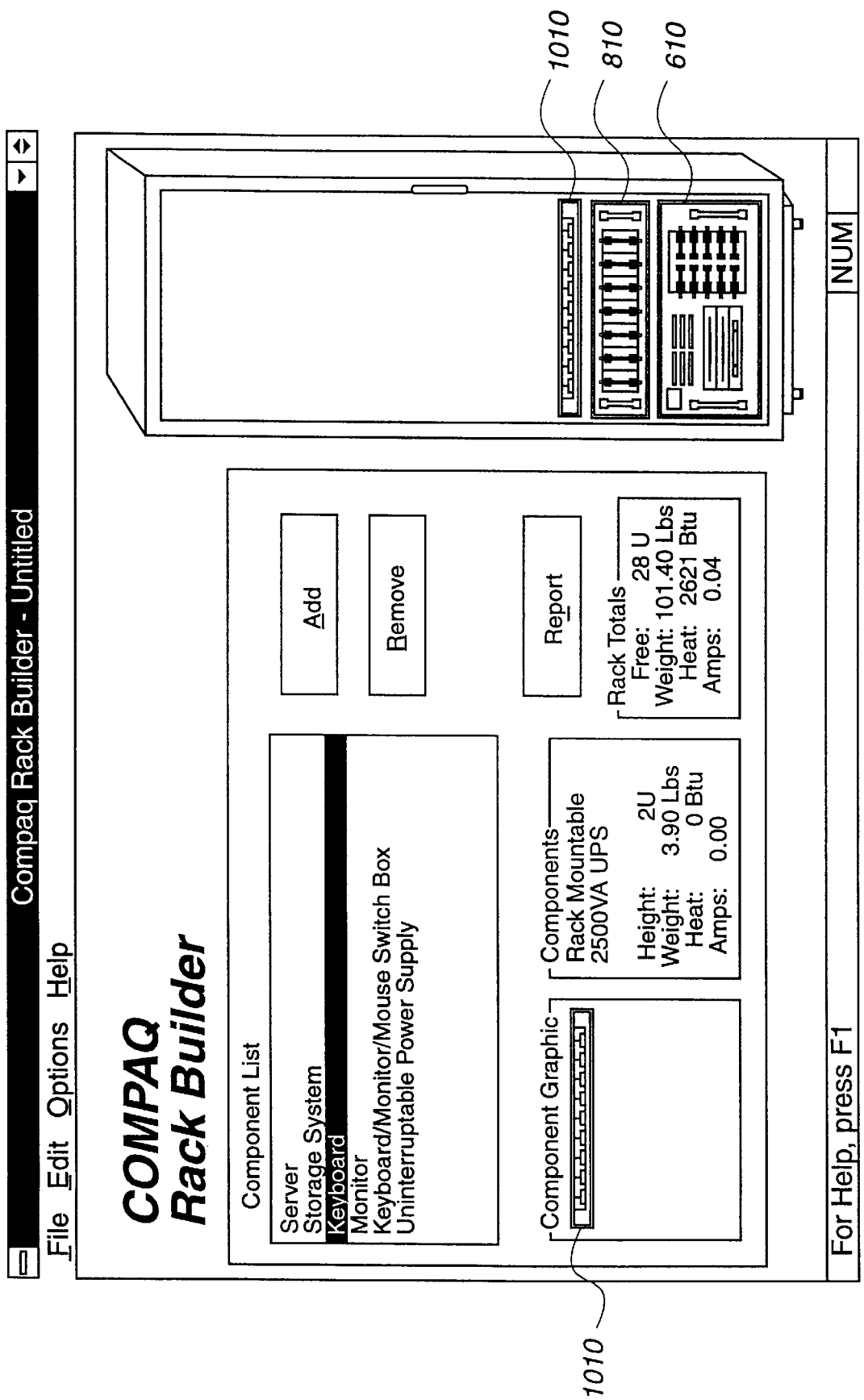
FIG. 11 illustrates a view of the configuration window of FIG. 2, showing, in particular, loading the chosen keyboard into a rack representation.

Turning now to FIG. 11, illustrated is a view of the configuration window 200 of FIG. 2, showing, in particular, loading the chosen keyboard 1020 into a rack representation. The user adds the chosen keyboard 1020 selected in FIG. 10 to the rack representation area 290 by clicking on the selection add button 260. At this time, the keyboard icon 1010 is displayed in the rack representation area 290 of the configuration window 200 with the server icon 610 and the storage system icon 810 and the rack configuration data and remaining available free space are displayed in the rack total characteristic area 250. Since the auto-arrange function is employed, the components are optimally placed in the rack representation.

Figure 12:
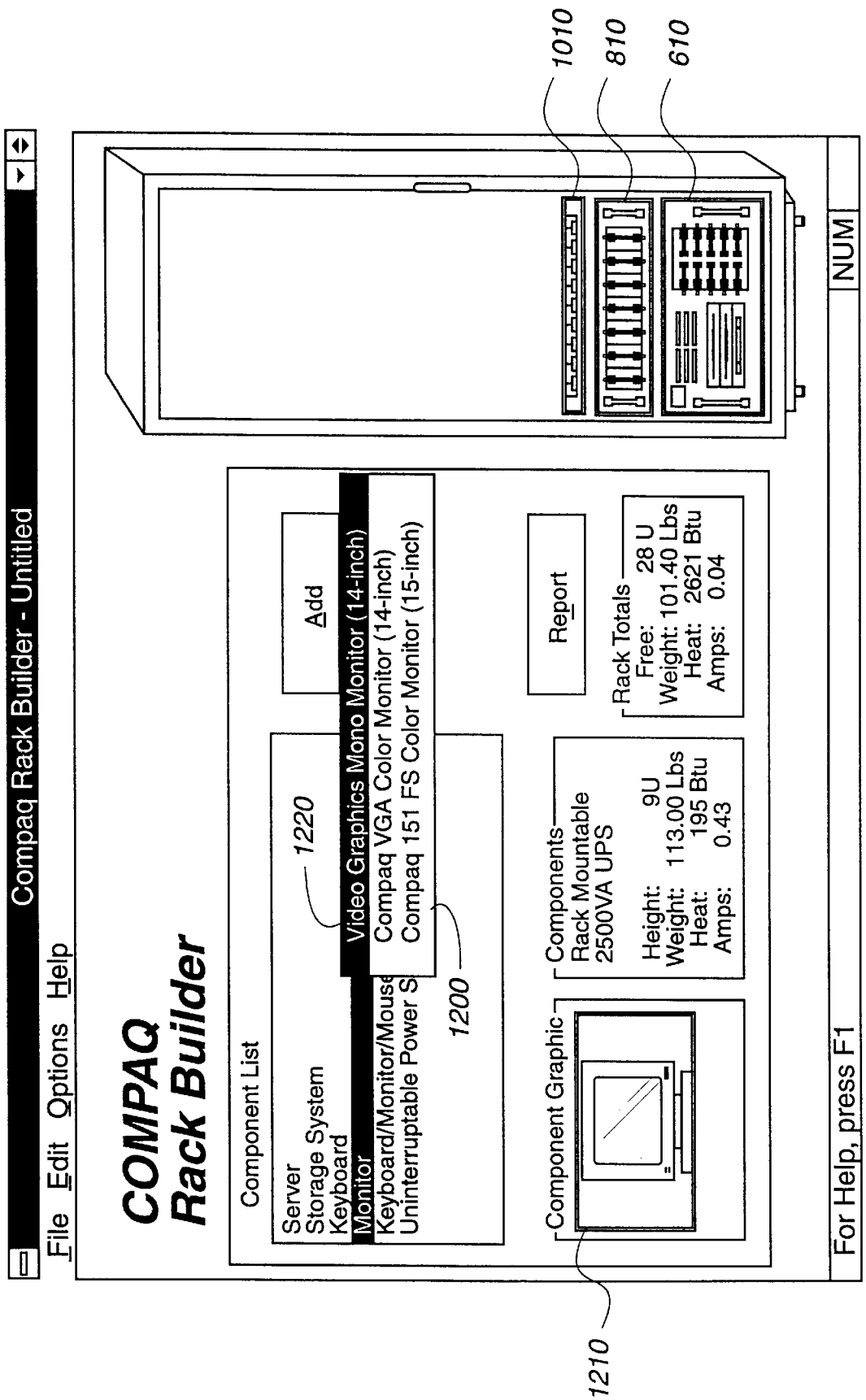
FIG. 12 illustrates a view of the configuration window of FIG. 2 showing, in particular, a monitor submenu and selection of a chosen monitor.

Turning now to FIG. 12, illustrated is a view of the configuration window 200 of FIG. 2, showing, in particular, a monitor submenu 1200 and selection of a chosen monitor 1220. A monitor 222 provides the visual interface between the user and the system of the present invention. The monitor submenu 1200 displays alternatives available to the user for the monitor 222. When the user clicks on the alternative within the monitor submenu 1200, a monitor icon 1210 representing the chosen monitor 1220 is graphically displayed in the component graphic area 230 of the configuration window 200 and the component data of the chosen monitor 1220 appears in the component characteristic area 240 of the configuration window 200.

Figure 13:
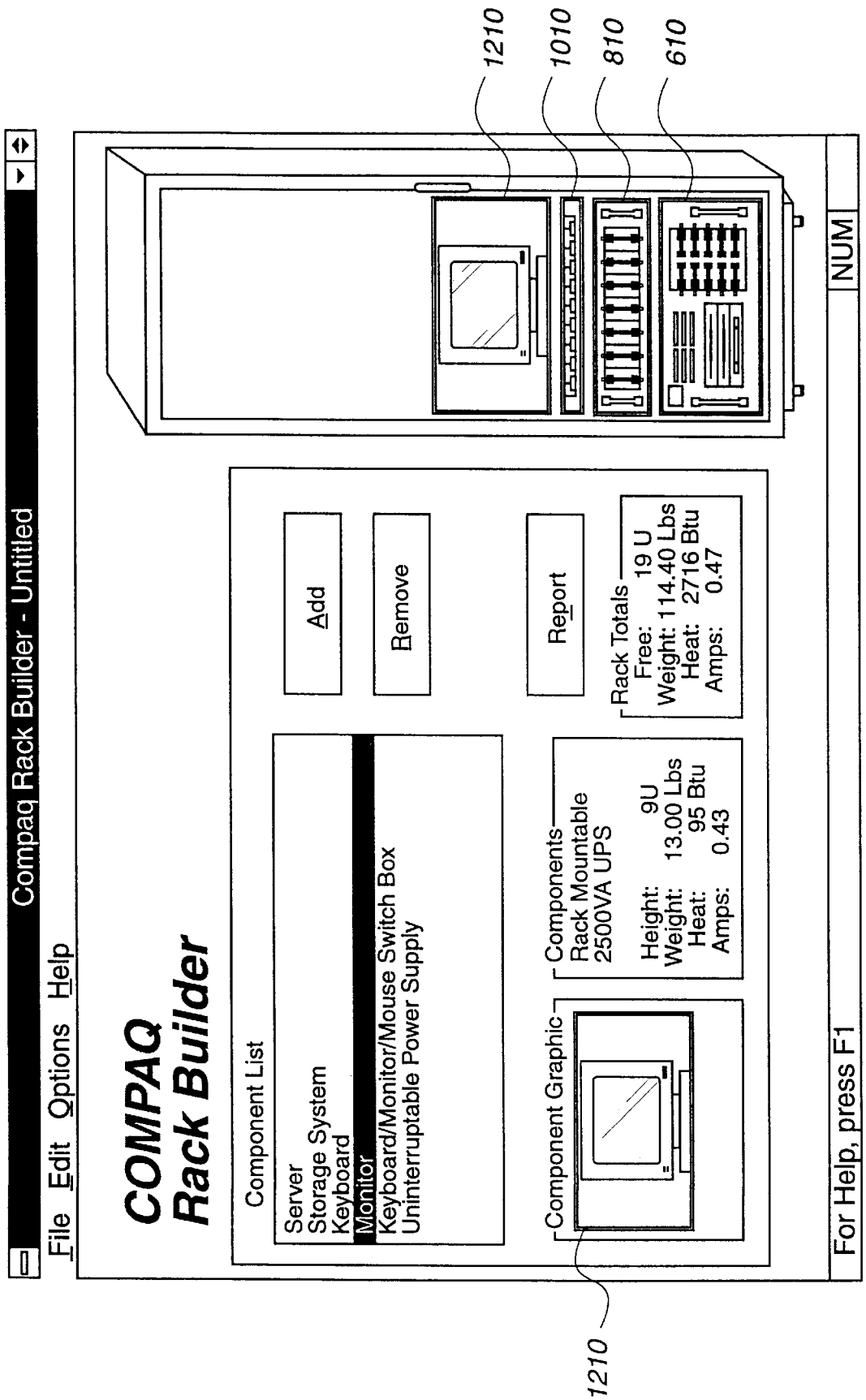
FIG. 13 illustrates a view of the configuration window of FIG. 2, showing, in particular, loading the chosen monitor into a rack representation.

Turning now to FIG. 13, illustrated is a view of the configuration window 200 of FIG. 2, showing, in particular, loading the chosen monitor 1220 into a rack representation. The user adds the chosen monitor 1220 selected in FIG. 12 to the rack representation area 290 by clicking on the selection add button 260. At this time, the monitor icon 1210 is displayed in the rack representation area 290 of the configuration window 200 with the server icon 610, the storage system icon 810 and the keyboard icon 1010 and the rack configuration data and remaining available free space is displayed in the rack total characteristic area 250. Since the auto-arrange function is employed, the components are optimally placed in the rack representation.

Figure 14:
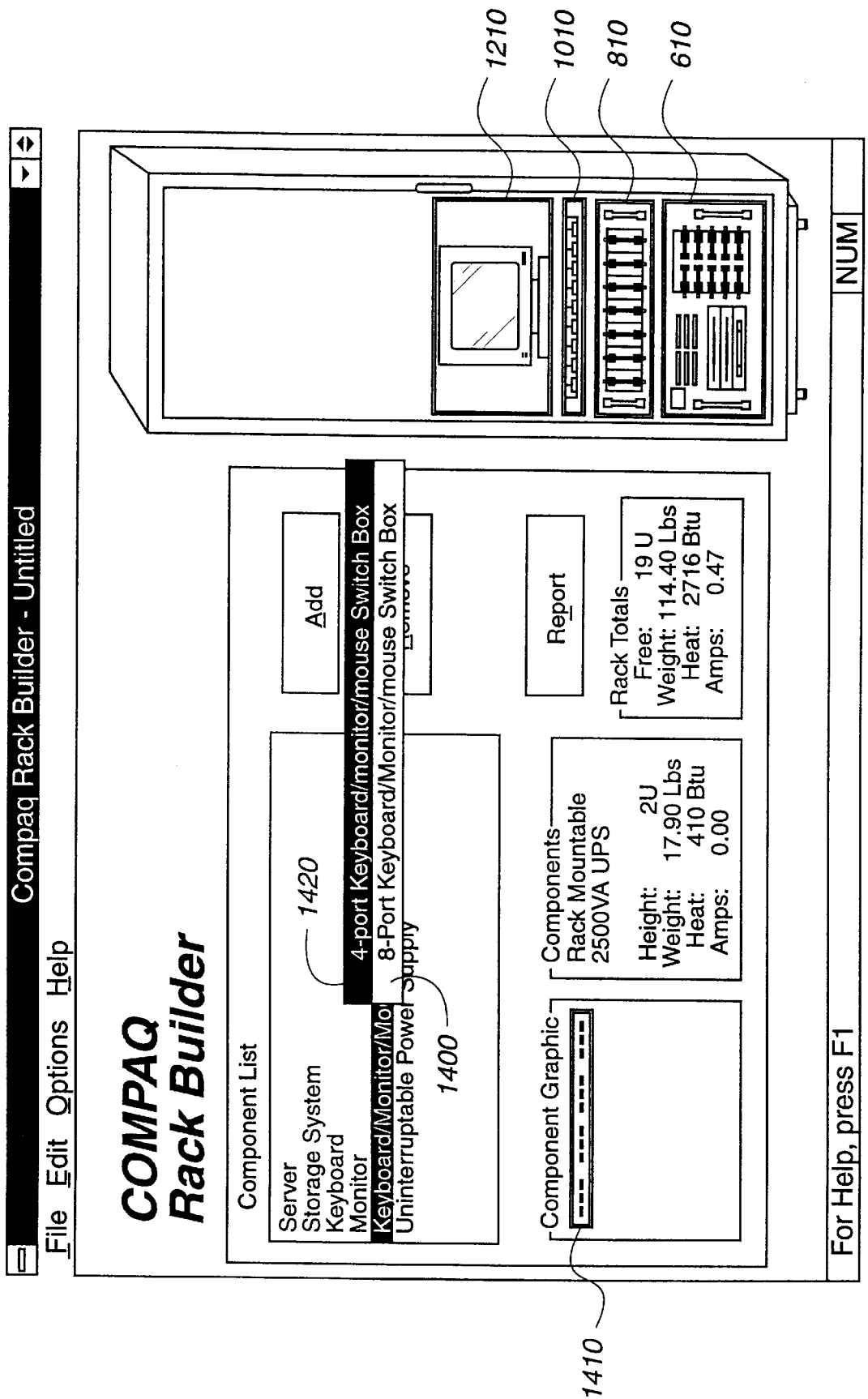
FIG. 14 illustrates a view of the configuration window of FIG. 2, showing, in particular, a keyboard/monitor/mouse switch box submenu and selection of a chosen keyboard/monitor/mouse switch box.

Turning now to FIG. 14, illustrated is a view of the configuration window 200 of FIG. 2, showing, in particular, a keyboard/monitor/mouse switch box submenu 1400 and selection of a chosen keyboard/monitor/mouse switch box 1420. A keyboard/monitor/mouse switch box 225 provides the mechanism for making the connections for the three devices. The keyboard/monitor/mouse switch box submenu 1400 displays alternatives available to the user for the keyboard/monitor/mouse switch box 225. When the user clicks on the alternative within the keyboard/monitor/mouse switch box submenu 1400, a keyboard/monitor/mouse switch box icon 1410 representing the chosen keyboard/monitor/mouse switch box 1420 is graphically displayed in the component graphic area 230 of the configuration window 200 and the component data of the chosen keyboard/monitor/mouse switch box 1420 appears in the component characteristic area 240 of the configuration window 200.

Figure 15:
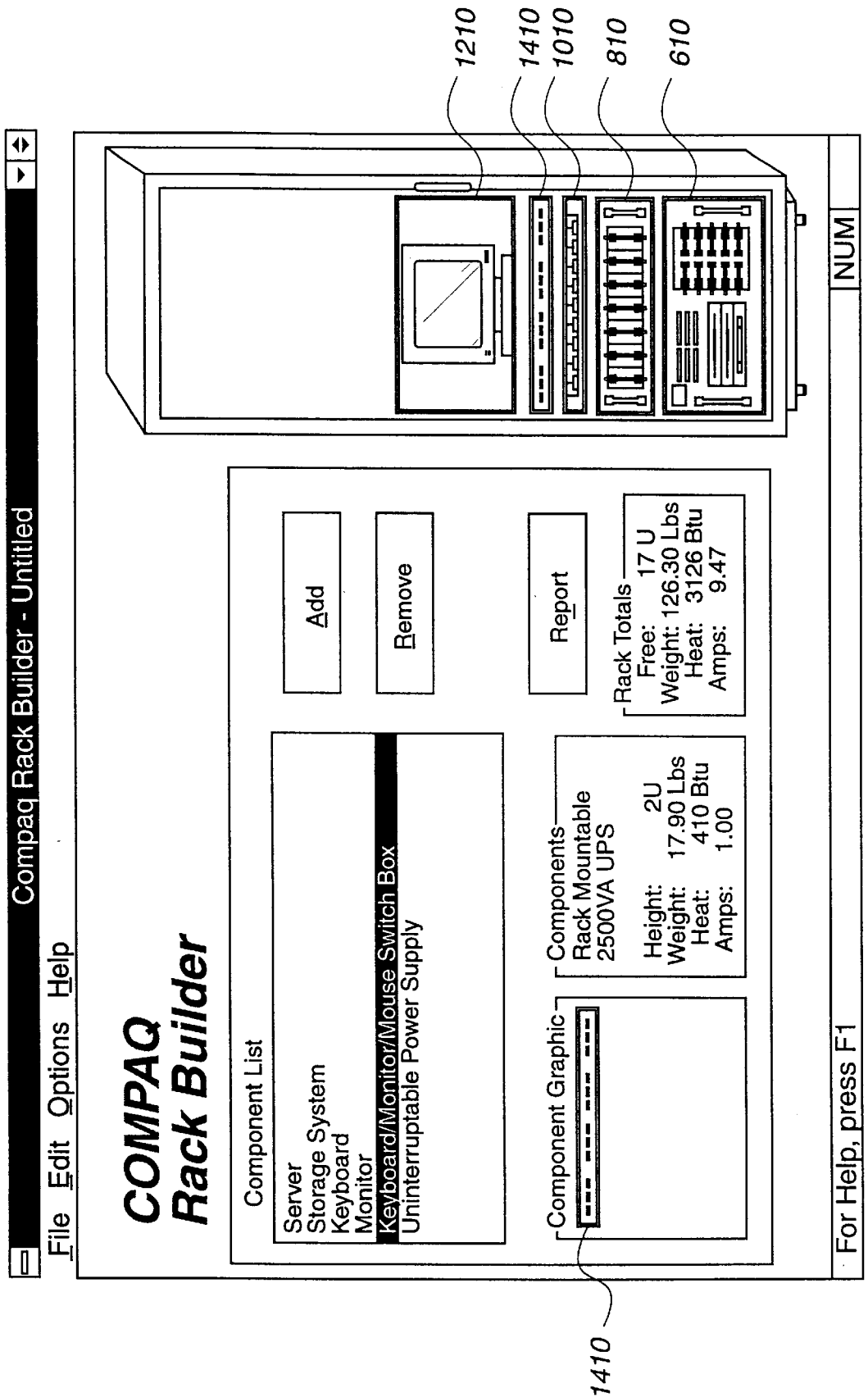
FIG. 15 illustrates a view of the configuration window of FIG. 2, showing, in particular, loading the chosen keyboard/monitor/mouse switch box into a rack representation.

Turning now to FIG. 15, illustrated is a view of the configuration window 200 of FIG. 2, showing, in particular, loading the chosen keyboard/monitor/mouse switch box 1420 into a rack representation. The user adds the keyboard/monitor/mouse switch box 1420 selected in FIG. 14 to the rack representation area 290 by clicking on the selection add button 260. At this time, the keyboard/monitor/mouse switch box icon 1410 is displayed in the rack representation area 290 of the configuration window 200 with the server icon 610, the storage system icon 810, the keyboard icon 1010 and the monitor icon 1210 and the rack configuration data and remaining available free space are displayed in the rack total characteristic area 250. Since the auto-arrange function is employed, the components are optimally placed in the rack representation.

Figure 16:
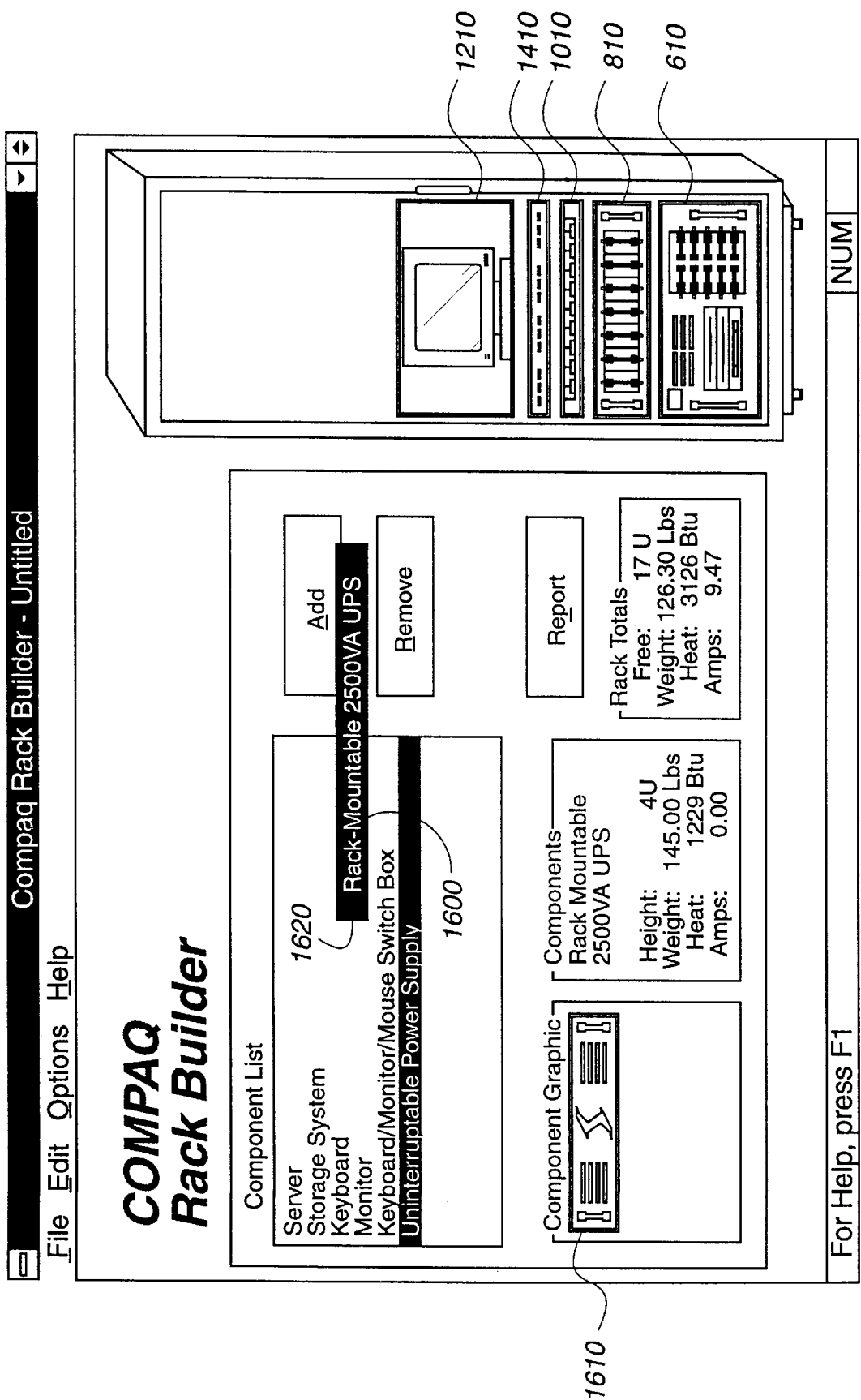
FIG. 16 illustrates a view of the configuration window of FIG. 2, showing, in particular, an uninterruptable power supply submenu and selection of a chosen uninterruptable power supply.

Turning now to FIG. 16, illustrated is a view of the configuration window 200 of FIG. 2, showing, in particular, a uninterruptable power supply submenu 1600 and selection of a chosen uninterruptable power supply 1620. An uninterruptable power supply 228 provides uninterrupted power to the rack-mountable PC even during a power outage or if a power cable is detached from a power supply. The uninterruptable power supply submenu 1600 displays alternatives available to the user for the uninterruptable power supply 228. When the user clicks on an alternative within the uninterruptable power supply submenu 1600, an uninterruptable power supply icon 1610 representing the chosen uninterruptable power supply 1620 is graphically displayed in the component graphic area 230 of the configuration window 200 and the component data for the chosen uninterruptable power supply 1620 appears in the component characteristic area 240 of the configuration window 200.

Figure 17:
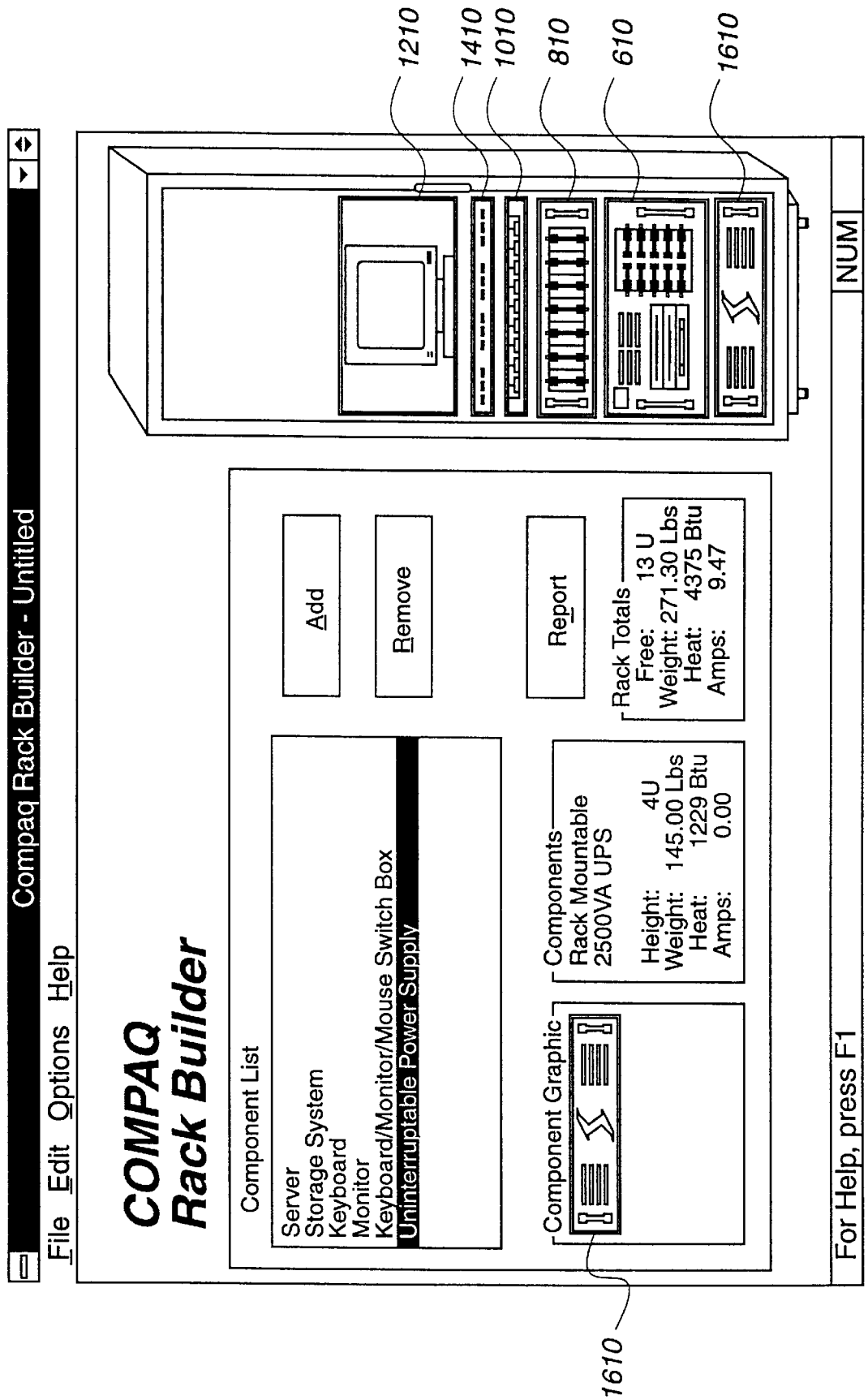
FIG. 17 illustrates a view of the configuration window of FIG. 2, showing, in particular, loading the chosen uninterruptable power supply into a rack representation.

Turning now to FIG. 17, illustrated is a view of the configuration window 200 of FIG. 2, showing, in particular, loading the chosen uninterruptable power supply 1620 into a rack representation. The user adds the chosen uninterruptable power supply 1620 selected in FIG. 15 to the rack representation area 290 by clicking on the selection add button 260. At this time, the uninterruptable power supply icon 1610 is displayed in the rack representation area 290 of the configuration window 200 with the server icon 610, the storage system icon 810, the keyboard icon 1010, the monitor icon 1210, and the keyboard/monitor/mouse switch box icon 1410 and the rack configuration data and remaining available free space are displayed in the rack total characteristic area 250. Since the auto-arrange function is employed, the components are optimally placed in the rack representation.

The server icon 610, the storage system icon 810, the keyboard icon 1010, the monitor icon 1210, the keyboard/monitor/mouse switch box icon 1410 and the uninterruptable power supply icon 1610 shown in the rack representation area 290 of FIG. 17 represent chosen components that constitute a specific rack-mountable PC configured in FIGS. 617.

Figure 18:
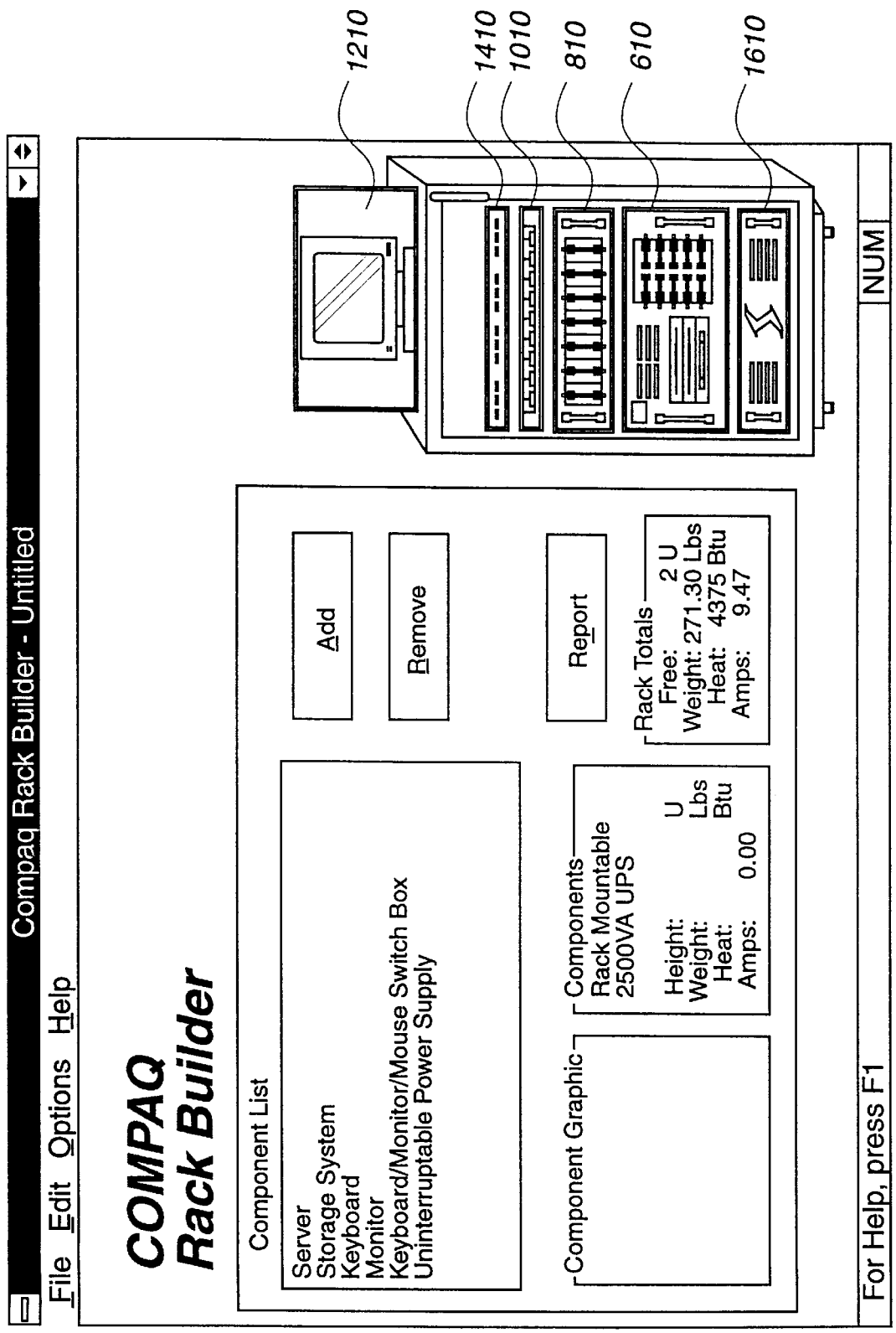
FIG. 18 illustrates a view of the configuration window of FIG. 2, showing, in particular, the chosen components selected in FIGS. 6, 8, 10, 12, 14 and 16 loaded into an alternative size rack representation.

Turning now to FIG. 18, illustrated is a view of the configuration window 200 of FIG. 2, showing, in particular, the chosen components selected in FIGS. 6, 8, 10, 12, 14 and 16 loaded into an alternative size rack representation. In this embodiment of the present invention, the server icon 610, storage system icon 810, keyboard icon 1010, monitor icon 1210, keyboard/monitor/mouse switch box icon 1410 and uninterruptable power supply icon 1610 representing the chosen components selected in the previous FIGS., are shown in a 22-unit rack representation. The alternative rack size is accessible by the user in the option menu 500 introduced in FIG. 5. The user may select a 42-unit rack size (as shown in the rack representations of the previous FIGS.) or 22-unit rack size by clicking on either selection when in the option menu 500. A distinct set of rules apply to each rack size. For example, the monitor icon 1210 is displayed on top of the 22-unit rack, because, on the smaller rack, the monitor 222 generally sits on top of the rack. The safe rack configuration rules discussed above clarify the applicable rules.

Figure 19:
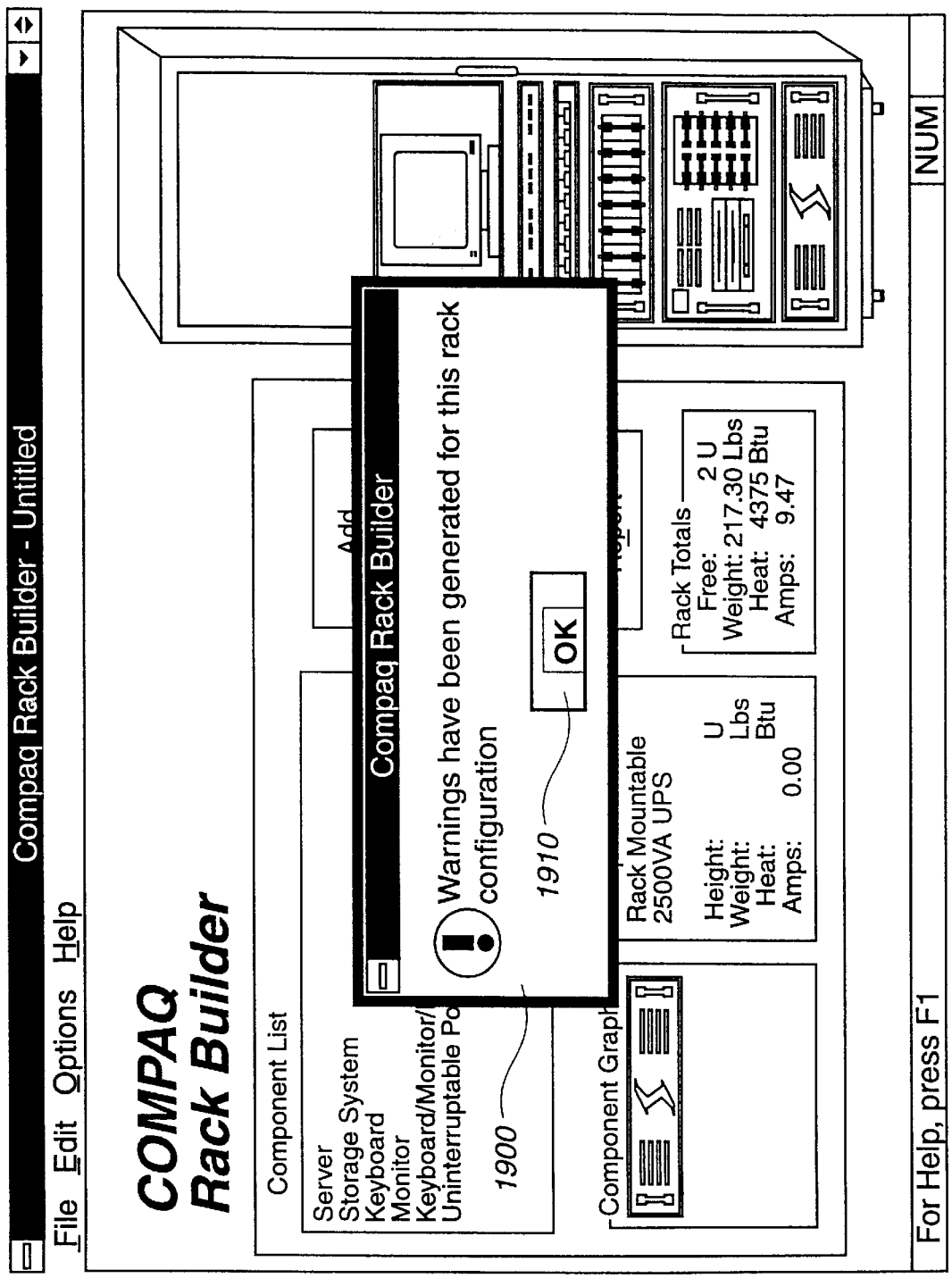
FIG. 19 illustrates a view of the configuration window of FIG. 2, showing, in particular, a warning message generated for a specific rack-mountable PC configured in FIGS. 6–17.

Turning now to FIG. 19, illustrated is a view of the configuration window 200 of FIG. 2, showing, in particular, a warning message 1900 generated for the specific rack-mountable PC configured in FIGS. 6–17. The display circuitry displays, on the configuration window 200, a warning to the user when there is an incompatibility among the chosen ones of the list of alternative computer components. Because the system understands component characteristics and can determine compatibility, the system should be able to warn the user upon the occurrence of an incompatibility. Accordingly, the system preferably does so by displaying the warning message 1900 to the user.

The warning message 1900 appears on the configuration window 200 when the user clicks on the report button 280 after selecting chosen ones of the list of alternative components from the component list area 210. The user can view the details regarding the warning message 1900 by clicking the warning "OK" button 1910 on the warning message 1900.

Figure 20:
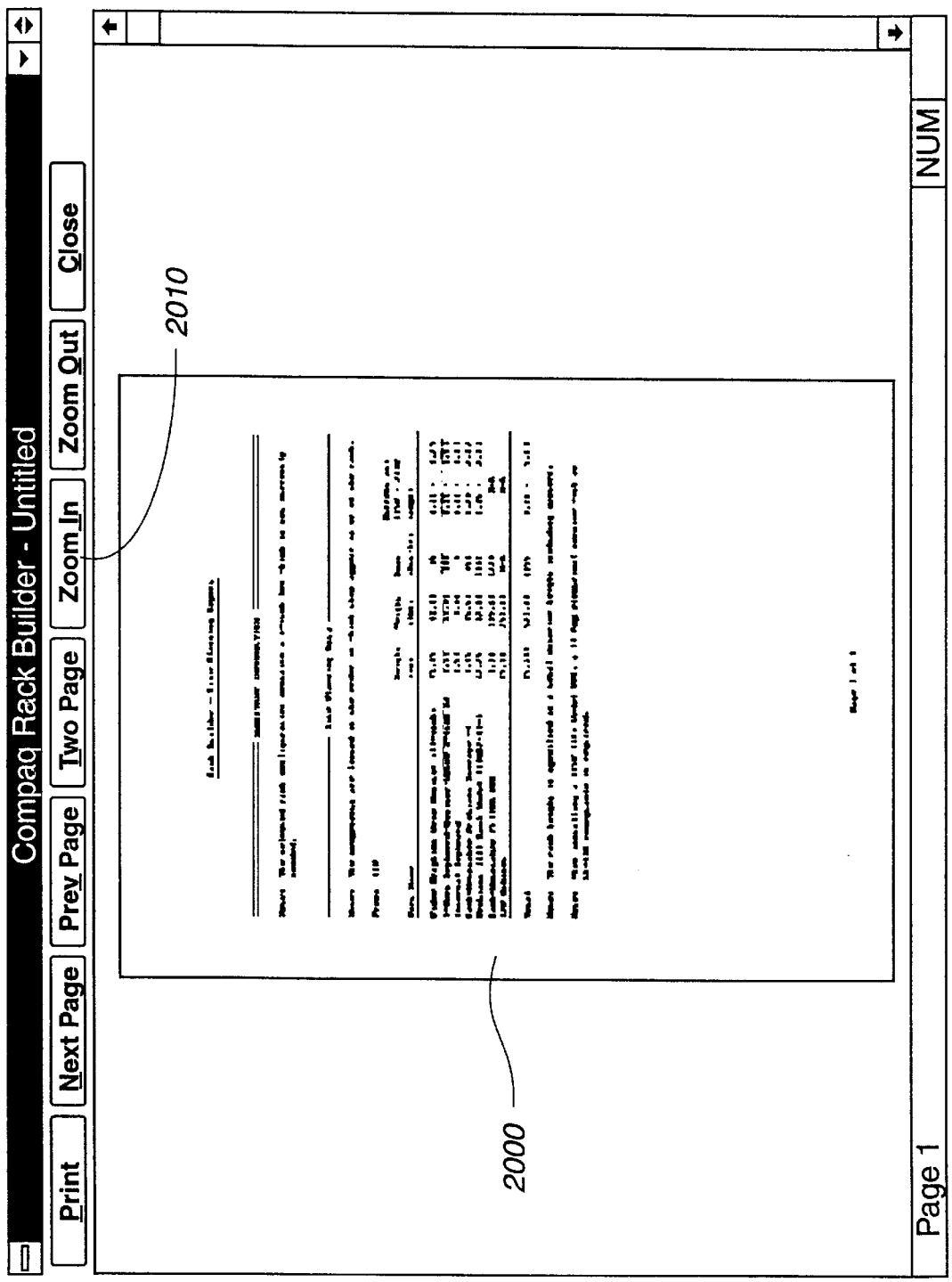
FIG. 20 illustrates a view of the display device of FIG. 1, showing, in particular, a representative page of a report generated for the specific rack-mountable PC configured in FIGS. 6–17.

Turning to FIG. 20, illustrated is a view of the display device 150 of FIG. 1, showing, in particular, a representative page 2000 of a report generated for the specific rack-mountable PC configured in FIGS. 6–17. While the page 2000 as shown is not legible, the user, through the "zoom in" button 2010, may enlarge sections of the representative page 2000 on the display device 150.

Generally, a report for a rack-mountable PC is a three page document. The first page of the report lists important information pertaining to a warning indication and further lists site planning data which includes the rack configuration data. The second page of the report lists ordering information, including part name, part number, and quantity required to configure a rack. The last page of the report provides a graphical representation of the as-configured rack.

Turning more specifically to the contents of each page and with continuing reference to FIG. 2, the important information section of the first page specifies the reason that rack is improperly configured. One or more reasons, explained in the form of a note or notes, may appear in the important information section. The notes should be closely reviewed as they contain valuable information about a rack configuration.

A list of possible component-specific configuration problems include, for example, that the configuration does not contain a server, thus warning the user to consider adding one or more servers 213 to the rack. While on the subject of servers, another viable concern is that the rack configuration contains several servers 213, thus warning the user to consider adding a switch box 225 with four ports or a switch box 225 with eight ports. With respect to the switch box 225, often the rack configuration contains a switch box 225 that is not currently needed, or the rack configuration contains a switch box 225 but does not contain a monitor 222 and/or a keyboard 219.

The system of the present invention notifies the user when the rack configuration does not contain a monitor 222, or the monitor 222 has been placed between two rack components and it is strongly recommended that components are not installed above the monitor 222 to avoid possible interference and heat problems. The system of the present invention also notifies the user when the rack configuration does not contain a keyboard 219 and, as a result, the user should consider ordering an external keyboard. With respect to the UPS 228, a possible reason for a warning is that the installed components consume more power than the UPS 228 can deliver and, if the user plans to hook all components to the UPS 228, the user should consider adding another UPS 228.

There are several general warning messages as well. A common indication is that the user has placed heavier components above lighter components and it is recommended that the components be arranged heaviest to lightest from the bottom up. To solve this problem, the auto-arrange feature can be implemented. The system notifies the user when the auto-arrange feature is not being used and further suggests that the user should consider using the auto-arrange feature.

Moreover, the system of the present invention notifies the user to use one pair of side panels per suite of racks and, when coupling racks together, to purchase one less coupling kit than the number of racks to be coupled. Also, the system of the present invention notifies the user of the rack height, specified as a total exterior height including casters. Electrically, the system tells the user, for example, when extender cables are needed to connect the keyboard 219 to the server 213.

Furthermore, the system specifies that the components are listed in the order in which they appear in the rack. With respect to ordering, the system specifies when part numbers include multiple items, and, for part numbers shown with "XXX", that the user should contact a local supplier representative for additional information. Also, the system tells the user when the site planning data may be inaccurate due to an incomplete specification of an unlisted component. Finally, the system specifies when individual components may require further configuration information, such as memory, disks, etc.

The first page of the report for the specific rack-mountable PC configured in FIGS. 6–17 includes an important information section and a site planning data section accompanied by several notes. The important information section generated as a result of the warning message 1900 (illustrated in FIG. 19) states that the selected rack configuration contains a chosen keyboard/monitor/mouse switch box 1420 that is not currently needed. The user can modify the existing rack by re-entering the configuration window 200 and removing the chosen keyboard/monitor/mouse switch box 1420.

The site planning data of the first page is displayed in TABLE 1 below. Several explanatory notes accompany the site planning data in the site planning data section. First, the components are listed in the order in which they appear in or on the rack and that 13 units of free space are available for the specific rack-mountable PC. Furthermore, the rack height is a total exterior height including casters, and electrically when installing a 115 V 60 Hz model UPS 228, 30 Ampere electrical service with an L5-30R receptacle is required.

TABLE 1

| Part Name | Height (in) | Weight (lbs) | Heat (Btu/hr) | Current at: 115 V/230 V (amps) |
|---|---|---|---|---|
| Video Graphics Mono Monitor (14-inch) | 15.75 | 13.00 | 95 | 0.43/0.25 |
| 4-Port Keyboard/ Monitor/ Mouse Switch Box | 3.50 | 11.90 | 410 | 1.00/0.50 |
| Internal Keyboard | 3.50 | 3.90 | 0 | 0.00/0.00 |
| Rack-Mountable ProLiant Storage −1 | 8.75 | 35.50 | 751 | 3.29/2.02 |
| ProLiant 1000 Rack Model 486DX2/66-1 | 12.25 | 62.00 | 1870 | 4.75/2.30 |
| Rack-Mountable 2500 VA UPS | 7.00 | 145.00 | 1229 | N/A |
| 42U Cabinet | 85.30 | 253.00 | N/A | N/A |
| TOTAL | 85.300 | 524.30 | 4355 | 9.47/5.07 |

The present invention further comprises data printing circuitry for producing a printed order containing an enumeration of the chosen ones of the list of alternative computer components and interconnecting cables to couple the chosen ones of the list of alternative computer components. This allows the system to print out the printed order that contains all of the information necessary to effect an order of the chosen components from a preferred vendor. Further, the system may produce both graphical and verbal installation instructions to the user to allow the user to install the computer when the chosen components arrive.

Generally, second page of the report contains order information with accompanying notes. The order information for the specific rack-mountable PC configured in FIGS. 6–17 is recorded in TABLE 2. The notes that accompany the order information for the specific rack-mountable PC configured in FIGS. 6–17 may be, e.g., that the individual components require further configuration information (such as for example the disk size for servers 213). The order information accompanying notes further suggested that some parts numbers include multiple items, and that for part numbers shown with "XXX" the user should contact the local representative for additional information.

TABLE 2

| Quantity | Part No. | Part Name |
|---|---|---|
| 1 | 165753-001 | 42U Cabinet |
|  | 165652-001 | 42U Side Panel Kit |
| Note: Purchase one (1) pair of side panels per group of racks. | | |
|  | 165664-001 | Rack Coupling Kit |
| Note: When Coupling racks, purchase one less coupling kit than the number of racks to be coupled. | | |
| 3 | 165668-001 | Rack Stabilizing Feet Kit |
| Note: When coupling racks, the Rack Stabilizing Feet Kit is not required. | | |
| 1 | 169940-001 | Blanking Panel Kit |
| 1 | 165644-001 | Keyboard/Monitor Shelf Kit |
| 1 | 165638-001 | CPU-to-Switchbox Cable |
| 1 | 187307-001 | Trackball |
| 1 | 194951-XXX | Video Graphics Mono Monitor (14-inch) |
| 1 | 169953-001 | 4-Port Keyboard/Monitor/Mouse Switch Box |
| 1 | 135914-XXX | Internal Keyboard |
| 1 | 163750-001 | Rack-Mountable ProLiant ™ Storage –1 |
| 1 | 163700-001 | ProLiant ™ 1000 Rack Model 486DX2/66-1 |
| 1 | 163760-001 | Rack-Mountable 2500 VA UPS |

Figure 21:
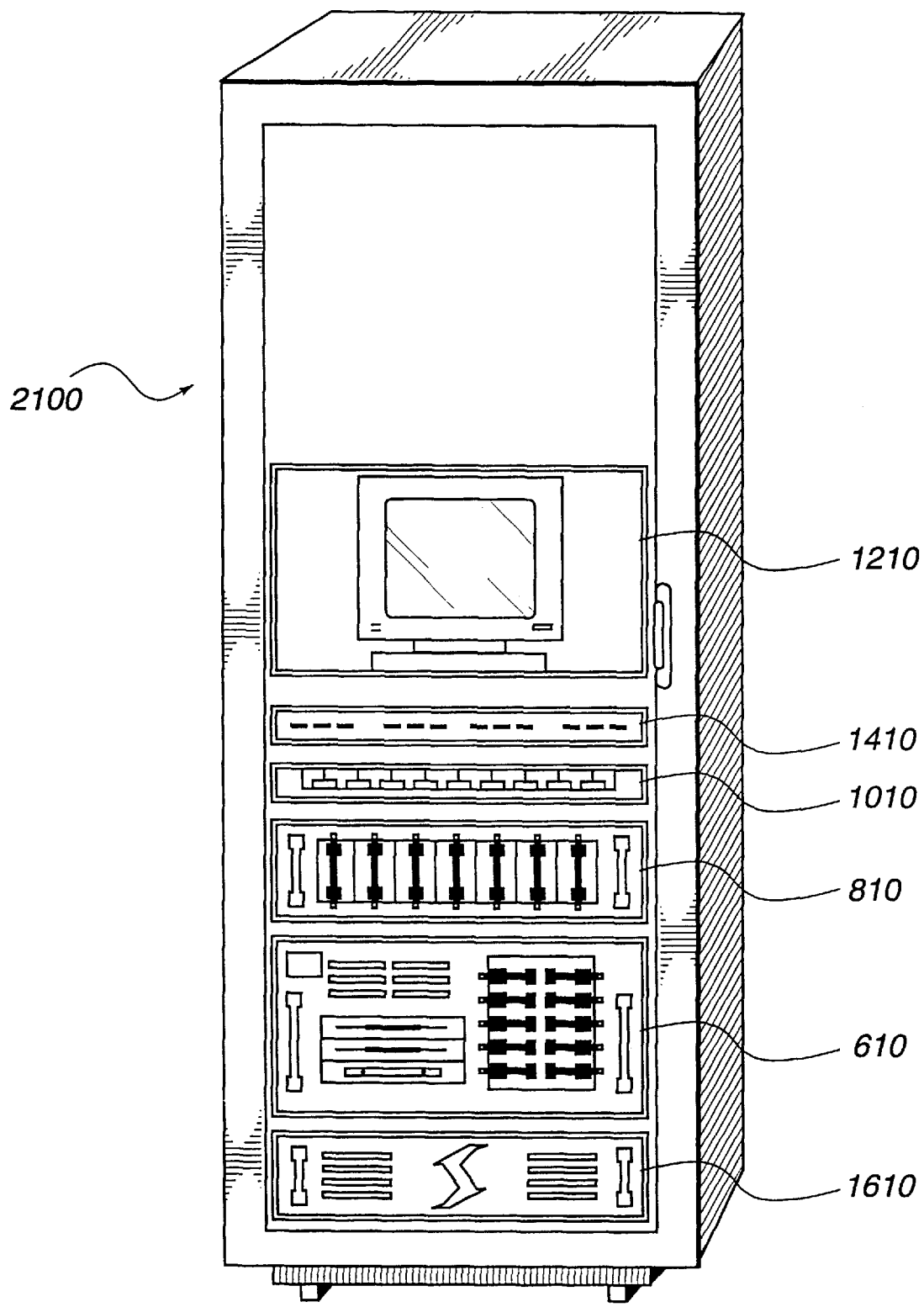
FIG. 21 illustrates a rack graphic of the specific rack-mountable PC configured in FIGS. 6–17.

Turning now to FIG. 21, illustrated is a rack graphic 2100 of the specific rack-mountable PC configured in FIGS. 6–17. Generally, the third page of the report contains a graphical representation of the configured rack. In the illustrated embodiment, the rack graphic 2100, incorporated into the third page of the report for the specific rack-mountable PC configured in FIGS. 6–17, contains the chosen ones of the list of alternative components selected in FIGS. 6, 8, 10, 12, 14 and 16. The rack graphic 2100 is a representation of a 42-unit rack. The rack graphic 2100 also displays the available free space in the rack.

From the above description, it is apparent that the present invention provides an automated system for facilitating creation of a compatible rack-mountable component personal computer. The system comprises: (1) data storage circuitry for containing a database of component data, the component data including a list of alternative computer components and a group of computer component characteristics associated with each of the alternative computer components, (2) data display circuitry for displaying graphical representations, on an associated display device, of multiple portions of the component data to a user, (3) data input circuitry for accepting user selection data from the user, the user selection data including chosen ones of the list of alternative computer components, the user providing the user selection data by manipulating the graphical representations on the display device and (4) data processing circuitry for evaluating a compatibility of the chosen ones of the list of alternative computer components, the evaluating means employing the associated group of computer component characteristics to determine the compatibility, the chosen ones of the list of alternative computer components forming a portion of computer configuration data, the data display circuitry capable of displaying the computer configuration data to the user.

Although the present invention and its advantages have been described in detail, those skilled in the art should understand that they can make various changes, substitutions and alterations herein without departing from the spirit and scope of the invention in its broadest form.

What is claimed is:

1. A system for assembling computer configuration data for a configured computer from component data and user selection data, said configuration data to be displayed on a display means, said system comprising:

means for displaying on said display means multiple portions of said component data to a user, said component data being displayed includes a list of alternative computer components and a group of computer component characteristics associated with each of said alternative computer components;

means for accepting said user selection data from said user, said user selection data including chosen ones of said computer components from said list of alternative computer components being displayed on said display means;

means for evaluating a compatibility among said chosen ones of said computer components from said list of alternative computer components, said evaluating means employing said associated group of computer component characteristics to determine said compatibility, said chosen ones of said computer components from said list of alternative computer components forming a portion of said computer configuration data;

means for outputting said computer configuration data to said display means; and means for producing a graphical depiction of the configured computer as being configured by said user selection, said graphical depiction being displayed on said display means and provides an external appearance of the configured computer system, and as said user selection chooses one of said computer components from said list of alternative computer components, the graphical depiction of the external appearance of the configured computer displayed on said display means is updated to display graphical representations of the chosen computer component.

2. The system as recited in claim 1 further comprising means for choosing a relative placement of said chosen ones of said computer components from said list of alternative computer components in the configured computer.

3. The system as recited in claim 2 wherein said displaying means comprises means for presenting a graphical representation of at least one of said alternative computer components and displaying said computer component characteristics associated therewith on said display means.

4. The system as recited in claim 2 wherein said display means displays the graphical depiction of the configured computer having the graphical representations of said chosen ones of said computer components from said list of alternative computer components contained therein in accordance with the chosen relative placement.

5. The system as recited in claim 1 wherein one of said computer component characteristics is a component thermal output.

6. The system as recited in claim 1 wherein one of said computer component characteristics is a component power requirement.

7. The system as recited in claim 1 further comprising means for selecting interconnecting cables to couple said chosen ones of said computer components from said list of alternative computer components.

8. The system as recited in claim 1 further comprising means for producing a printed order containing an enumeration of said chosen ones of said computer components from said list of alternative computer components and interconnecting cables to couple said chosen ones of said list of alternative computer components.

9. The system as recited in claim 1 further comprising means, coupled to said evaluating means, for providing a warning to said user when there is an incompatibility among said chosen ones of said computer components from said list of alternative computer components.

10. The system as recited in claim 1 wherein said system is embodied in general purpose data processing and storage circuitry.

11. An automated system for facilitating creation of a compatible rack-mountable component computer, comprising:
    data storage circuitry for containing a database of component data, said component data including alternative computer components and a group of computer component characteristics associated with each of said alternative computer components;
    data display circuitry for displaying representations, on an associated display device, a list of said alternative computer components;
    data input circuitry for accepting user selection data from said user, said user selection data including chosen ones of said computer components from said list of alternative computer components; and
    data processing circuitry for evaluating a compatibility of said chosen ones of said computer components from said list of alternative computer components, said evaluating uses said associated group of computer component characteristics to determine said compatibility, said chosen ones of said computer components from said list of alternative computer components forming a portion of computer configuration data,
    wherein said data display circuitry displays said computer configuration data to said user, and
    wherein said display circuitry further displays a graphical depiction of an external appearance of a mounting rack on the display device, and as said user chooses one of said computer components from said list of alternative computer components, the graphical depiction of the external appearance of the mounting rack is updated to display graphical representations of the chosen computer component, thus allowing said user to visually monitor the creation of said rack-mountable component computer.

12. The system as recited in claim 11 wherein said data processing circuitry chooses a relative placement of said chosen ones of said computer components from said list of alternative computer components for said rack-mountable component computer.

13. The system as recited in claim 12 wherein said data display circuitry displays the graphical depiction of the mounting rack having graphical representations of said chosen ones of said computer components from said list of alternative computer components contained therein in accordance with the chosen relative placement.

14. The system as recited in claim 11 wherein one of said computer component characteristics is a component power requirement.

15. The system as recited in claim 11 wherein one of said computer component characteristics is a component thermal output.

16. The system as recited in claim 11 wherein said display circuitry displays a graphical representation of the chosen computer component and displays said computer component characteristics associated with the chosen computer component.

17. The system as recited in claim 11 wherein said data processing circuitry selects interconnecting cables to couple said chosen ones of said list of alternative computer components.

18. The system as recited in claim 11 further comprising data printing circuitry for producing a printed order containing an enumeration of said chosen ones of said computer components from said list of alternative computer components and interconnecting cables to couple said chosen ones of said computer components from said list of alternative computer components.

19. The system as recited in claim 11 wherein said display circuitry displays, on said associated display device, a warning to said user when there is an incompatibility among said chosen ones of said computer components from said list of alternative computer components.

20. The system as recited in claim 11 wherein said data storage circuitry, data display circuitry, data input circuitry and data processing circuitry form a portion of a personal computer (PC).

21. A computer readable medium containing program instructions for assembling computer configuration data for a configured computer from component data and user selection data, said configuration data to be displayed on a display device, said computer readable medium comprising:
    computer readable program instructions for displaying on the display device multiple portions of said component data to a user, said component data being displayed includes a list of alternative computer components and a group of computer component characteristics associated with each of said alternative computer components;
    computer readable program instructions for receiving said user selection data from said user, said user selection data identifying chosen ones of said computer components from said list of alternative computer components;
    computer readable program instructions for evaluating a compatibility among said chosen ones of said computer components from said list of alternative computer components, said evaluating employs at least said associated group of computer component characteristics to determine said compatibility, said chosen ones of said computer components from said list of alternative computer components forming a portion of said computer configuration data; and
    computer readable program instructions code outputting said computer configuration data to said display device.

22. The computer readable media as recited in claim 21 further comprising:
    computer readable program instructions for determining a relative placement of said chosen ones of said computer components from said list of alternative computer components in the configured computer.

23. The computer readable media as recited in claim 22 wherein said display device displays an external appearance of the graphical depiction of the configured computer having the graphical representations of said chosen ones of said computer components from said list of alternative computer components contained therein in accordance with the chosen relative placement.

24. The computer readable media as recited in claim 21 wherein one of said computer component characteristics is a component power requirement.

25. The computer readable media as recited in claim 21 wherein one of said computer component characteristics is a component thermal output.

26. The computer readable media as recited in claim 21 further comprising:

computer readable program instructions for presenting a graphical representation of an external appearance of at least one of said alternative computer components and displaying said computer component characteristics associated therewith on said display device.

27. The computer readable media as recited in claim 21 further comprising:

computer readable program instructions for selecting interconnecting cables to couple said chosen ones of said computer components from said list of alternative computer components.

28. The computer readable media as recited in claim 21 further comprising:

computer readable program instructions for producing a printed order containing an enumeration of said chosen ones of said computer components from said list of alternative computer components and interconnecting cables to couple said chosen ones of said list of alternative computer components.

29. The computer readable media as recited in claim 21 further comprising:

computer readable program instructions for providing a warning to said user when there is an incompatibility among said chosen ones of said computer components from said list of alternative computer components.

* * * * *